US012418339B2

(12) United States Patent
Lehnich et al.

(10) Patent No.: US 12,418,339 B2
(45) Date of Patent: *Sep. 16, 2025

(54) STREETLIGHT-BASED TELECOMMUNICATIONS SYSTEM AND SUPPORT UNIT FOR USE THEREIN

(71) Applicant: UBICQUIA, INC., Fort Lauderdale, FL (US)

(72) Inventors: Joerg Christian Lehnich, Nehmten (DE); Steve Paul Wines, Marlow (GB)

(73) Assignee: Ubicquia, Inc., Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/534,672

(22) Filed: Dec. 10, 2023

(65) Prior Publication Data

US 2024/0106522 A1    Mar. 28, 2024

Related U.S. Application Data

(63) Continuation of application No. 18/090,247, filed on Dec. 28, 2022, now Pat. No. 11,843,445, which is a
(Continued)

(51) Int. Cl.
*H04B 7/15* (2006.01)
*H04B 7/155* (2006.01)
(Continued)

(52) U.S. Cl.
CPC .......... *H04B 7/15507* (2013.01); *H02G 3/08* (2013.01); *H05K 5/00* (2013.01)

(58) Field of Classification Search
CPC .... H04B 7/15507; H04B 7/2606; H02G 3/08; H05K 5/00
See application file for complete search history.

(56) References Cited

U.S. PATENT DOCUMENTS

| | | | |
|---|---|---|---|
| 2012/0319616 A1* | 12/2012 | Quilici | F21V 23/04 362/244 |
| 2013/0055257 A1* | 2/2013 | Yamashita | G06F 9/5077 718/1 |

(Continued)

FOREIGN PATENT DOCUMENTS

WO    WO-2019136480 A2 *    7/2019    ............. F21S 8/086

OTHER PUBLICATIONS

Korean Intellectual Property Office, International Search Report issued in connection with grandparent application's counterpart International Application No. PCT/US2021/048922, Dec. 10, 2021, 6 pages.

(Continued)

*Primary Examiner* — Hashim S Bhatti
(74) *Attorney, Agent, or Firm* — Daniel C. Crilly

(57) ABSTRACT

A telecommunications (telecom) system providing communications for remote cellular transceivers includes a core network and at least one telecom support unit mounted to a respective structure and providing communications connectivity between the cellular transceivers and the core network. The telecom support unit includes a housing, a powerline interface, a communication interface, and a load-side power metering circuit. The powerline interface is configured though a boundary of the housing and connectable to an external power source. The communication interface is operable to provide communicative coupling to one or more of the remote cellular transceivers and may be configured through a second boundary of the housing. The load-side power metering circuit is operable to meter power consumed by at least the telecom support unit. When configured for connection to a streetlight, the telecom support unit may further include a clamp to enable mechanical coupling of the housing to the streetlight's support structure.

17 Claims, 6 Drawing Sheets

Related U.S. Application Data continuation of application No. 17/464,627, filed on Sep. 1, 2021, now Pat. No. 11,558,104.

(60) Provisional application No. 63/073,807, filed on Sep. 2, 2020.

(51) Int. Cl.
*H02G 3/08* (2006.01)
*H05K 5/00* (2006.01)

(56) References Cited

U.S. PATENT DOCUMENTS

| | | | | |
|---|---|---|---|---|
| 2013/0163505 A1* | 6/2013 | Lysejko | ............... | H04W 72/12 370/315 |
| 2018/0062729 A1* | 3/2018 | Linehan | ................... | H04B 7/14 |
| 2019/0174608 A1 | 6/2019 | Verfuerth | | |
| 2019/0261456 A1* | 8/2019 | Lee | ..................... | H01Q 1/1242 |
| 2020/0145048 A1* | 5/2020 | Gerszberg | ................ | H04B 3/52 |
| 2020/0217468 A1* | 7/2020 | Brown | .................... | H04W 4/90 |
| 2020/0235732 A1 | 7/2020 | Hutson et al. | | |
| 2020/0335228 A1* | 10/2020 | Yuan | ..................... | H04L 67/565 |
| 2020/0358476 A1* | 11/2020 | Chamberlain | ............ | H01Q 1/44 |
| 2021/0059645 A1* | 3/2021 | Song | ..................... | A61B 8/4444 |
| 2022/0092707 A1* | 3/2022 | Pandharpure | .......... | G01R 22/10 |
| 2022/0141124 A1* | 5/2022 | Takeshita | ............... | H04L 45/123 370/217 |
| 2023/0204638 A1* | 6/2023 | Dudding | ............ | G01R 19/1659 324/126 |

OTHER PUBLICATIONS

Korean Intellectual Property Office, Written Opinion of the International Searching Authority issued in connection with grandparent application's counterpart International Application No. PCT/US2021/048922, Dec. 10, 2021, 5 pages.

European Patent Office, Extended European Search Report issued in connection with grandparent application's counterpart European Application No. 21865136.2, Sep. 6, 2024, 8 pages.

* cited by examiner

STREETLIGHT-BASED TELECOMMUNICATIONS SYSTEM AND SUPPORT UNIT FOR USE THEREIN

CROSS-REFERENCE TO RELATED APPLICATIONS

The present application is a continuation of U.S. application Ser. No. 18/090,247, which was filed on Dec. 28, 2022, and is incorporated herein by reference in its entirety. U.S. application Ser. No. 18/090,247 is a continuation of U.S. application Ser. No. 17/464,627, now U.S. Pat. No. 11,558,104, which was filed on Sep. 1, 2021, and is incorporated herein by reference in its entirety. U.S. application Ser. No. 17/464,627 claims priority upon and the benefit of U.S. Provisional Application No. 63/073,807, which was filed on Sep. 2, 2020, and is incorporated herein by reference in its entirety.

TECHNICAL FIELD

The present disclosure relates generally to telecommunications support units and, more particularly, to a streetlight-mountable telecommunications support unit that may be configured as a baseband device, a repeater device, or a combined baseband/repeater device.

BACKGROUND

Known streetlight controllers have onboard photo-sensitive circuitry that is arranged to generate one or more outputs based on sensed light in the area proximate the photo-sensitive circuitry. When the photo-sensitive circuitry of the streetlight controller detects that ambient light has fallen below a threshold, the streetlight is directed to turn on, and when the circuity detects that ambient light has risen above a threshold, the streetlight is directed to turn off.

Known baseband units are used in the telecommunications industry to communicatively couple mobile telephonic devices (e.g., cellular telephones, tablet computers, and the like) to a land-based telecommunications infrastructure, such as packet switched telephone network (PSTN). Generally, a mobile telephonic device forms a point-to-point communications path between itself and a base transceiver station (BTS), which may be otherwise referred to as a "cell tower," a "cell," a "base station," or some other like term. The BTS includes antenna structures, transceivers, digital signal processor (DSP) circuitry, control electronics, a timing source (e.g., a global positioning system (GPS) receiver), power circuitry, and an interface to an exchange or switch, which completes the path to and from the land-based telecommunications infrastructure.

Known repeaters may be referred to as mid-points in a cellular telecommunications industry. Known repeaters are used to wirelessly receive cellular-based wireless data at an input and wirelessly communicate such data to another mid-point or endpoint in the telecommunications system.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventors' approach to the particular problem, which, in and of itself, may also be inventive.

SUMMARY

The following is a summary of the present disclosure to provide an introductory understanding of some features and context. This summary is not intended to identify key or critical elements of the present disclosure or to delineate the scope of the disclosure. This summary presents certain concepts of the present disclosure in a simplified form as a prelude to the more detailed description that is later presented.

The device, method, and system embodiments described in this disclosure (i.e., the teachings of this disclosure) relate to telecommunications (telecom) support unit (TSU) that may operate as a baseband unit, a cellular telecom repeater, or a combined baseband unit and cellular telecom repeater.

The TSU may include or exclude cellular transceiver circuitry that operates as a remote radio head. When such remote radio head circuitry exists, the TSU is configured to communicate with wireless computing devices such as smartphones, tablets, and the like. The baseband functionality of the TSU enable bidirectional communications between an endpoint device and a core network of a mobile network operator (MNO).

The TSU may also include a microcontroller and associated circuitry controllable by the microcontroller. For example, the microcontroller may implement smart streetlight functions to control one or more light sources of one or more streetlights. The microcontroller may further control or otherwise cooperate with, and retrieve data from, utility-grade power metering circuitry. In these cases, the power metering circuitry may measure line power, load power, or line and load power. Other functionality provided by the microcontroller and associated circuitry may include tilt-sensors, vibration sensors, environmental data sensors, global positioning system circuitry, circuits that uniquely identify the TSU within a system of TSUs, over-the-air software updating software and circuitry, alarms, and the like.

In a first embodiment, a telecommunications system may include a plurality of remote radio head devices, a core network, and at least one telecom support unit mounted to and receiving power from a streetlight. The telecom support unit may include a housing, a clamp mechanically coupling the housing to a support structure of the streetlight, a powerline interface integrated though a first wall of the housing and electromechanically coupling the telecom support unit to utility power, and a high-bandwidth communication medium interface integrated through a second wall of the housing, where the high-bandwidth communication medium interface communicatively couples the telecom support unit to at least one of the remote radio head devices.

In some cases of the first embodiment, the telecom support unit further includes at least one remote radio head device. In some cases, the telecom support unit further includes a single cellular telecommunications transceiver, where the single cellular telecommunications transceiver is arranged for mobile network operator subscriber-based communications only.

In some cases of the first embodiment, the telecom support unit is configured as a combined baseband and cellular repeater device; in other cases, the telecom support unit is configured as a baseband device; and in still other cases, the telecom support unit is configured as a cellular data repeater device. The streetlight-based telecom support unit may further comprise a microcontroller arranged to control operations of at least one streetlight. Sometimes, the streetlight-based telecom support unit further comprises a line-side utility-grade power metering circuit; and a load-side utility-grade power metering circuit, wherein the line-side utility-grade power metering circuit and load-side utility-grade power metering circuit are arranged to operate concurrently. Sometimes, the high-bandwidth communication medium interface is a dark fiber interface, and other times, the high-bandwidth communication medium interface is a lit fiber interface. In some embodiments, the high-bandwidth communication medium interface is a wireless interface, and in at least some of these cases, the high-bandwidth communication medium interface is a wireless interface having at least one software-defined antenna.

In a second embodiment, a streetlight-based telecom support unit, comprises: a generally rectangular housing; a standardized powerline connector arranged to mate with a corresponding standardized powerline socket integrated into a streetlight luminaire; a clamp arranged to mechanically couple the housing to a streetlight support arm, the clamp further arranged to reduce mechanical strain on the standardized powerline connector during rotational coupling of the standardized powerline connector with the corresponding standardized powerline socket; and a high-bandwidth communication medium interface, the high-bandwidth communication medium interface arranged to communicatively couple the streetlight-based telecom support unit to at least one a plurality of remote radio head devices.

In some cases, the streetlight-based telecom support unit is configured as a baseband device, a cellular data repeater device, or a combined baseband and cellular data repeater device. Sometimes, the generally rectangular housing of the telecom support unit includes a bottom surface integrated with a top surface by at least one angled wall, and the bottom surface has a larger area and profile than the top surface. In at least some embodiments, the high-bandwidth communication medium interface is a dark fiber interface.

In a third embodiment, a streetlight-based telecom support unit method, comprises: providing a telecom support unit electromechanically coupled to a streetlight; forming a communication link between the telecom support unit and at least one streetlight-based remote radio head; and bidirectionally communicating cellular data between the telecom support unit and the at least one streetlight-based remote radio head.

The streetlight-based telecom support unit method of the third embodiment may further comprise: forming a second communication link between the telecom support unit and a core network, and in some of these cases, the second communication link includes at least one dark fiber conduit. Additionally, or alternatively the streetlight-based telecom support unit method of the third embodiment may further comprise forming a second communication link between the telecom support unit and a second streetlight-based telecom support unit, and sometimes, the second communication link includes at least one lit fiber conduit. Sometimes the streetlight-based telecom support unit method of the third embodiment also includes programmatically selecting whether the streetlight-based telecom support unit will operate as at least one of a baseband device, a cellular data repeater device, or a combined baseband and cellular data repeater device.

This Brief Summary has been provided to describe certain concepts in a simplified form that are further described in more detail in the Detailed Description. The Brief Summary does not limit the scope of the claimed subject matter, but rather the words of the claims themselves determine the scope of the claimed subject matter.

BRIEF DESCRIPTION OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

Figure 1:
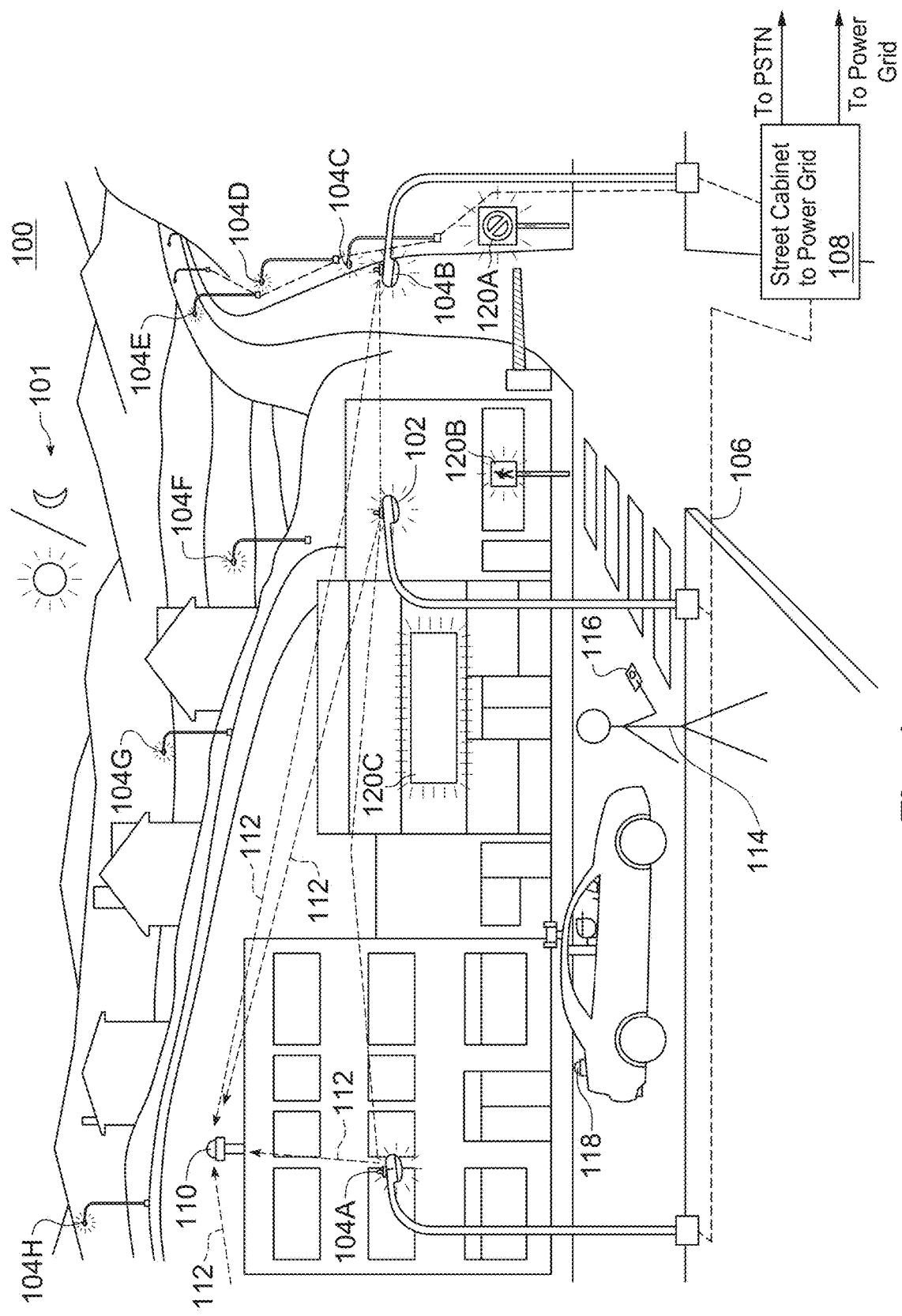
FIG. 1 illustrates an exemplary system level deployment having a plurality of IIOT device embodiments.

The present disclosure may be understood more readily by reference to this detailed description and the accompanying figures. The terminology used herein is for the purpose of describing specific embodiments only and is not limiting to the claims unless a court or accepted body of competent jurisdiction determines that such terminology is limiting. Unless specifically defined herein, the terminology used herein is to be given its traditional meaning as known in the relevant art.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with computing systems including client and server computing systems, as well as networks have not been shown or described in detail to avoid unnecessarily obscuring descriptions of the embodiments.

The device, method, and system embodiments described in this disclosure (i.e., the teachings of this disclosure) discuss non-limiting, yet detailed, embodiments of a streetlight-based telecom support unit. The telecom support unit (TSU) may be configured as a baseband device, a repeater device, or a combined baseband/repeater device that is mountable in a streetlight fixture. The TSU may also optionally include a smart streetlight controller and other smart streetlight features as described in the present disclosure. In some cases, the TSU has a transceiver configured to communicate with one or more wireless computing devices (e.g., subscriber devices, cell phones, smartphones, IOT devices, IIOT devices, and the like); and in other cases, the TSU does not have any transceiver configured to communicate with personal mobile devices.

To avoid confusing or obfuscating the inventive subject matter disclosed herein, the present disclosure will predominantly describe system, method, and device embodiments in the context of a TSU arranged as a baseband unit, a cellular telecom repeater unit, or a combined baseband and cellular telecom repeater unit. Nevertheless, one of skill in the art will recognize that the principles described herein are not so limited, and such principles may be equally applicable to other streetlight-based internet of things (IOT) and industrial internet of things (IIOT) devices that are mounted or mountable in a standardized streetlight controller socket. Unless expressly described herein, or unless the context demands otherwise, each use of the term TSU may be interchangeably replaced with the term and functionality of a baseband unit, a cellular telecom repeater, or a combined baseband and cellular telecom repeater unit.

Rather than a general-purpose computing device, a TSU is arranged as a processor-based device arranged to perform a particular function or set of functions. The TSU may be arranged as a repeater that receives and re-transmits cellular telecom data through and around geographic areas that are obstructed or otherwise occluded from traditional cellular telecommunications (e.g., communications passed between a wireless computing device and a small cell or macrocell). The TSU may additionally or alternatively be arranged as a baseband unit that communicates data between one or more small cells and a core network of a mobile network operator (MNO). In these and other cases, the TSU may further provide additional functionality associated with smart city infrastructure such as smart lighting controls, environmental data collection and analysis, edge computing, and the like.

The TSU may be coupled to a streetlight luminaire via a standardized powerline interface. The standardized powerline interface defines a limited number of electrical/communicative conduits over which signals may be passed in-to or out-from the streetlight controller. In some cases, as will be discussed herein, the interface may be referred to as a NEMA interface, a NEMA socket, an ANSI C136 interface, an ANSI C136.41 interface, or the like.

A known NEMA interface typically implements the powerline interface with connectors and receptacles that include three, five, seven, or some other number of electrical/communicative conduits (e.g., pins, blades, springs, connectors, receptacles, sockets, and other like "contacts"). A set of three primary contacts carry a Line voltage signal, a Load voltage signal, and Neutral voltage signal. A set of four secondary contacts may be used by the streetlight controller to pass power, control information, status information, and the like. The four secondary contacts may be treated as a first pair of secondary contacts and a second pair of secondary contacts. In at least some cases, the known NEMA interface further implements a high-speed data interface of the type described in U.S. Pat. No. 10,873,170, which is incorporated herein by reference. Other NEMA interface implementations are also contemplated.

FIG. 1 is a system level deployment 100 having a plurality of IIOT device embodiments. Any number of IIOT devices are implemented as small cell networking devices, remote radio heads, smart streetlight controllers, and telecom support units (TSUs).

A small cell small cell networking device, as used in the present disclosure, is a very small base station. One or more small cells are deployed in a geographic cell site region. A small cell, as used herein, may be arranged as a picocell, a microcell, a femtocell, or the like. A small cell can be deployed indoors or outdoors; above ground or below ground. Typically, however, small cells as contemplated herein are deployed on the top of streetlights. A macro base station (e.g., a traditional cell tower or the like) integrates with a wide, high-data-capacity communications pipe coupled between the small cell and the core network. Differently, small cells are coupled to the core network via small communication pipes. Often, a fundamental purpose of a small cell is to increase a macrocell's edge data capacity, speed, and total network efficiency.

A remote radio head includes a transceiver front-end arranged for bi-directional communication with one or more wireless computing devices (e.g., subscriber devices, cell phones, smartphones, IOT devices, IIOT devices, and the like), and a transceiver back-end arranged for bi-directional communication, often via fiber-optic cable and Common Public Radio Interface (CPRI) protocol interface, with an MNO base station (e.g., radio control panel, base transceiver station (BTS), NodeB, eNodeB, or the like). A remote radio head typically includes RF circuitry, amplifier circuitry, analog-to-digital/digital-to-analog converters (ADC/DAC), up/down converters, and other supporting circuitry. A remote radio head is typically deployed to extend the coverage area of a base station.

A smart streetlight controller as described herein may also be referred to as Internet of Things (IOT) device or Industrial Internet of Things (IIOT) device. These smart streetlight controllers are electronic computing devices coupled or coupleable to a computing network. Such devices may include consumer facing applicability, industrial or machine-to-machine applicability, or the like. These smart streetlight controllers have one or more computing processors, memory storing instructions that direct operations of the one or more computing processors, and network circuitry. In many cases, these devices also include a power source (e.g., one or more of a battery, a physical power interface, power conversion circuitry, a power supply, a photovoltaic cell, an induction coil, etc.), at least one sensor (e.g., accelerometer, thermometer, pressure sensor, etc.), and memory to store data collected by the device. A smart streetlight controller described herein may be configured to identify its own terrestrial location, calculate the position and orientation of Earth relative to the sun, determine sunrise and sunset times at the terrestrial location of the smart streetlight controller, and control the light source accordingly. A user may in some cases direct a suitable offset be applied to the calculated time that a light source should turns on or turns off or otherwise control the streetlight. Other exemplary and non-limiting offsets may include manual adjustments, programmatic adjustments, adjustments for local weather conditions, adjustments for other celestial events (e.g., full moon, eclipse, and the like), adjustments for season, and adjustments for daylight savings time. And still other adjustments based on locally sensed circumstances and data available in one or more databases, repositories, websites, or other network-accessible sources are also contemplated.

The TSU of the system level deployment 100 may be implemented as one or more baseband units as described in the present disclosure, one or more repeaters as described in the present disclosure, one or more combined baseband and repeater units, one or more small cells, one or more remote radio heads, one or more streetlight controllers, and other like devices.

Streetlight fixtures in FIG. 1 are coupled to, or otherwise arranged as part of, a system of streetlight poles, and each streetlight fixture includes a light source. Each light source, light fixture, and light fitting, individually or along with their related components, may in some cases be interchangeably referred to as a luminaire, a light source, a streetlight, a streetlamp, or some other such suitable term.

In the system level deployment 100, at least one light pole includes a fixture with a TSU 102 configured as a baseband unit, a cellular telecom repeater unit, or a combined baseband and cellular telecom repeater unit. A plurality of other light poles include a smart sensor device 104A-104H. The smart sensor devices 104A-104H may be TSUs configured as repeaters, additional TSUs configured as baseband units, additional TSUs configured as combined baseband and repeater units, remote radio heads, smart light controllers, and the like. In the present disclosure, light poles having a smart sensor device 104A-104H may individually or collectively be referred to as light poles having a smart sensor device 104 or simply light poles 104 for brevity. In these cases, and for the purposes of the present disclosure, the smart sensor device of each light pole 104 may be structurally and operatively identical (i.e., having same or substantially similar circuitry and embedded software, and differing by way of one or more network-level system identifiers).

For the system level deployment 100 to operate efficiently and effectively, it is understood that not every streetlight or light pole needs to be configured with a TSU 102 or smart sensor device 104. In fact, many embodiments of a system level deployment 100 will configure fewer than fifty percent (50%), fewer than twenty-five percent (25%), fewer than ten percent (10%) and even fewer than five percent (5%) of the available light poles with a TSU 102 or smart sensor device 104.

To help convey the inventive subject matter of the present disclosure, however, the system level deployment 100 illustrates a plurality of light poles 102, 104 arranged in one or more determined geographic areas, and each light pole 102, 104 has at least one light source positioned in a fixture. The fixture will include the standardized powerline interface as described herein. The fixture is at least twenty feet above ground level and in at least some cases, the fixtures are between about 20 feet and 40 feet above ground level. In other cases, the streetlight fixtures may of course be lower than 20 feet above the ground or higher than 40 feet above the ground. In other system level deployments according to the present disclosure, there may be 1,000 or more light poles 102, 104 arranged in one or more determined geographic areas. In these or in still other cases, the streetlight fixtures may of course be lower than 20 feet above the ground or higher than 40 feet above the ground. Although described as being above the ground, streetlight fixtures shown and contemplated in the present disclosure may also be subterranean, but positioned above the floor, such as in a tunnel.

The system of streetlight poles, streetlight fixtures, streetlight sources, or the like in the system level deployment may be controlled by a utility, a municipality, or some other government agency. In other cases, the system streetlight poles, streetlight fixtures, streetlight sources, or the like in the system level deployment is controlled by a private entity (e.g., private property owner, third-party service contractor, or the like). In still other cases, a plurality of entities shares control of the system of streetlight poles, streetlight fixtures, streetlight sources, or the like. The shared control may be hierarchical or cooperative in some other fashion. For example, when the system is controlled by a municipality or a department of transportation, an emergency services agency (e.g., law enforcement, medical services, fire services) may be able to request or otherwise take control of the system. In still other cases, one or more sub-parts of the system of streetlight poles, streetlight fixtures, streetlight sources, or the like can be granted some control such as in a neighborhood, around a hospital or fire department, in a construction area, or in some other manner.

In the system level deployment 100 of FIG. 1, any number of streetlight poles 102, 104 and their associated fixtures may be arranged with a standardized powerline interface that is compliant with a roadway area lighting standard promoted by a standards body such as ANSI C136.41 (e.g., a NEMA-based connector/socket system). The connector permits the controlling or servicing authority of the system to competitively and efficiently purchase and install light sensors on each streetlight fixture. In addition, or in the alternative, the standardized connector in each streetlight fixture permits the controlling or servicing authority to replace a conventional light sensor with another device such as a TSU 102 (e.g., baseband unit, repeater, or combined baseband and repeater), a remote radio head, a small cell networking device, another type of smart sensor device embodied as a smart streetlight controller, an IIOT device, or some other type of smart sensor device 104.

Elements representing the sun and moon 101 are shown in FIG. 1. Light or the absence of light based on time of day, weather, geography, or other causes provide information (e.g., ambient light) to light sensors and other controllers of light pole mounted devices described in the present disclosure. Based on electronically captured or programmatically derived information, an associated light source may be suitably controlled.

In the system level deployment 100 of FIG. 1, various ones of the light poles may be 50 feet apart, 100 feet apart, 250 feet apart, or some other distance. In some cases, the type and performance characteristics of each TSU 102 or other smart sensor device 104 are selected based on their respective distance to other such devices such that wireless communications are acceptable.

The light pole and fixture with the TSU 102 and each light pole and fixture with a smart sensor device 104 may be directly or indirectly coupled to a street cabinet 108 or other like structure that provides communications and utility power (e.g., "the power grid") in a wired way. The utility power may provide 120 VAC, 208 VAC, 220 VAC, 240 VAC, 260 VAC, 277 VAC, 360 VAC, 415 VAC, 480 VAC, 600 VAC, or some other power source voltage. The communications may include high-bandwidth communications via a high-bandwidth medium such as a fiber optic cable. That is, each light pole and fixture with a TSU 102, and optionally one or more of the light poles and fixtures with smart sensor devices 104A-104H, are also coupled to the same street cabinet 108 or another structure via a wired backhaul connection. It is understood that these wired connections are in some cases separate wired connections (e.g., copper wire, fiber optic cable, industrial Ethernet cable, or the like) and in some cases combined wired connections (e.g., power over Ethernet (PoE), powerline communications (PLC), or the like).

For simplification of the system level deployment 100 of FIG. 1, a wired backhaul and power line 106 is illustrated as a single line. In the embodiment of FIG. 1, the street cabinet 108 is coupled to the power grid, which is administered by a licensed power utility agency, and the street cabinet 108 is coupled to the public switched telephone network (PSTN). In other embodiments, the street cabinet 108 may be electrically, communicatively, or electrically and communicatively to some other infrastructure (e.g., power source, satellite communication network, or the like) such as a windmill, generator, solar source, fuel cell, satellite dish, long- or short-wave transceiver, or the like.

In some embodiments, any number of TSU devices 102 and smart sensor devices 104 are arranged to provide utility grade power metering functions. The utility grade power metering functions may be performed with a circuit arranged apply any one or more of a full load, a partial load, and a load where voltage and current are out of phase (e.g., 60 degrees; 0.5 power factor). Other metering methodologies are also contemplated. Such metering circuits are arranged to provide acceptably accurate line side, load side, or line side and load side power metering information that enables a utility or other entity to determine any one or more of: 1) how much power enters the fixture; 2) how much power is consumed at the fixture; and 3) how much power exits the fixture.

In the embodiment of FIG. 1, each light pole and fixture with a smart sensor device 104 is in direct or indirect wireless communication with the light pole and fixture that has the small cell networking device 102. In addition, each light pole and fixture with a smart sensor device 104 and the light pole and fixture with the TSU 102 may also be in direct or indirect wireless communication 112 with an optional remote computing device 110. The remote computing device 110, when it is included in the system level deployment 100, may be controlled by a mobile network operator (MNO), a municipality, another government agency, a third party, or some other entity. By this optional arrangement, the remote computing device 110 can be arranged to wirelessly communicate light control signals and any other information (e.g., packetized data) between itself and each respective wireless networking device coupled to any of the plurality of light poles.

A user 114 holding a wireless computing device 116 (e.g., smartphone, tablet, wearable computing device, or the like) is represented in the system level deployment 100 of FIG. 1. A vehicle having an in-vehicle computing device 118 is also represented. The vehicle may be an emergency service vehicle, a passenger vehicle, a commercial vehicle, a public transportation vehicle, a drone, or some other type of vehicle. The user 114 may use their wireless computing device 116 to establish a wireless communication session over a cellular-based network controlled by an MNO, wherein packetized wireless data is passed between a smart sensor device 104 and the TSU 102. Concurrently, the in-vehicle computing device 118 may also establish a wireless communication session over the same or a different cellular-based network controlled by the same or a different MNO, wherein packetized wireless data of the second session is also passed between a smart sensor device 104 and a TSU 102.

Other devices may also communicate through light pole-based devices of the system level deployment 100. These devices may be IOT devices, IIOT devices, or some other types of smart devices. In FIG. 1, two public information signs 120A, 120B, and a private entity sign 120C are shown, but many other types of devices are contemplated. Each one of these devices may form an unlicensed wireless communication session (e.g., Wi-Fi) or a cellular-based wireless communication session with one or more wireless networks made available by the devices shown in the system level deployment 100 of FIG. 1.

Figure 2:
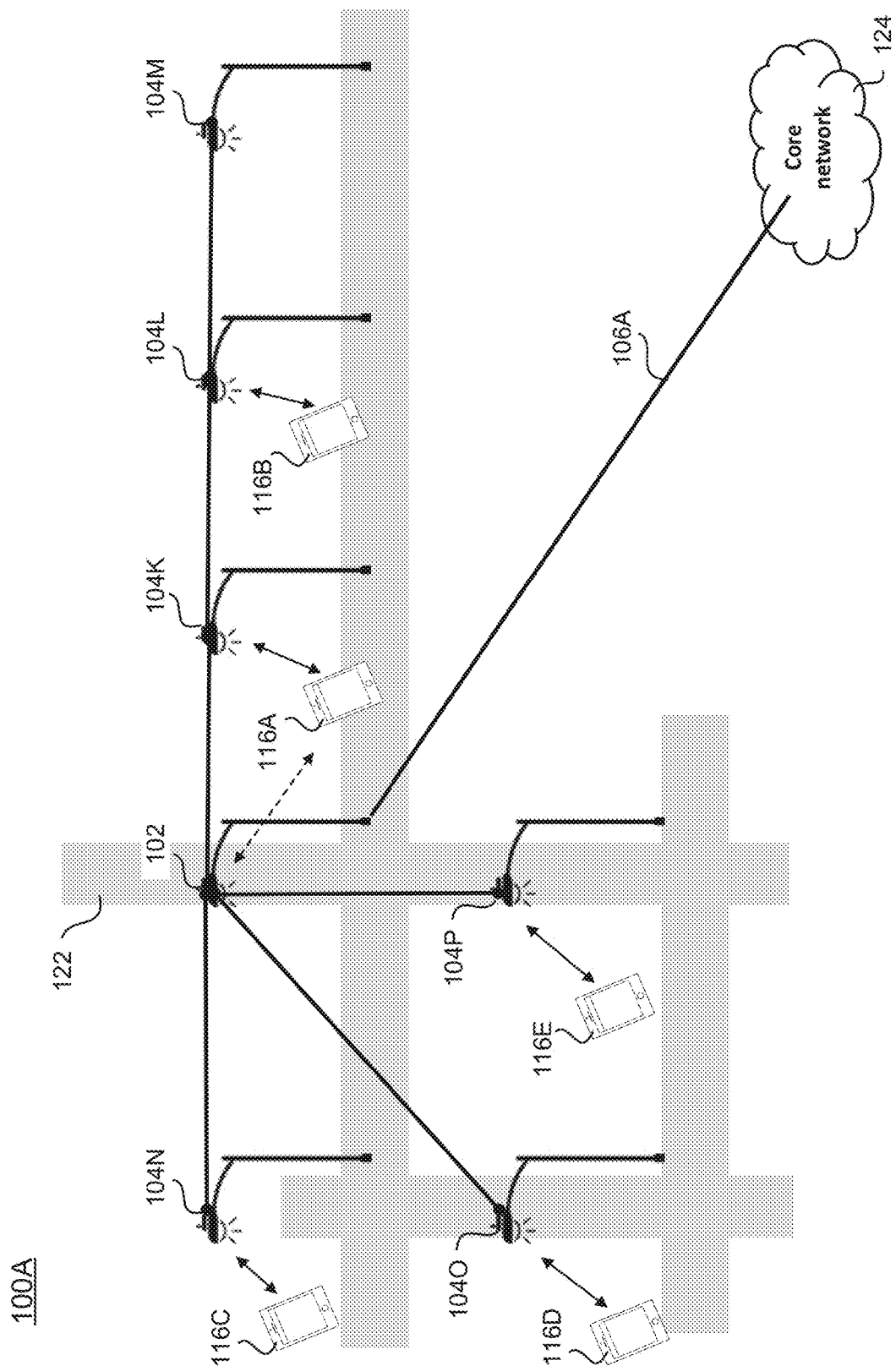
FIG. 2 illustrates an alternative exemplary system level deployment showing a telecom support unit (TSU) topology.

FIG. 2 is a system level deployment 100A showing a TSU topology embodiment. A first light pole and fixture with a TSU 102 is configured as a baseband unit. Other light poles and fixtures with smart sensor devices 104K-104P may be configured as TSUs, remote radio heads, smart light controllers, and the like. The light poles are vertically standing along various portions of a roadway 122. Certain ones of the smart sensor devices 104K-104P may be in wireless communications with certain wireless computing devices 116A-116E. The communications passed between each wireless computing device 116A-116E and each smart sensor device 104K-104P or TSU 102 may conform to any known cellular protocol using any known cellular technology (e.g., 3G, 4G, 5G, 6G, GSM, CDMA, and the like). To avoid unnecessarily cluttering in FIG. 2, individual communication paths to and from the wireless computing devices 116A-116E are not shown. The dashed communication path between wireless computing device 116A and TSU 102 is only present in optional cases where a TSU 102 is configured with a cellular wireless transceiver (e.g., remote radio head circuitry). A wired backhaul connection 106A communicatively and bi-directionally couples TSU 102 with a core network 124.

The TSU 102 is communication with smart sensor devices 104K, 104L, 104M in a daisy chain topology. The TSU 102 is in communication with smart sensor devices 104N, 104O, 104P in a star topology. In either topology individually (i.e., star or daisy chain), or in systems having a combined topology, a single TSU may provide high bandwidth, low latency connectivity to the land-based telecommunications infrastructure, such as packet switched telephone network (PSTN), which is otherwise referred to herein as a core network 124.

Figure 3:
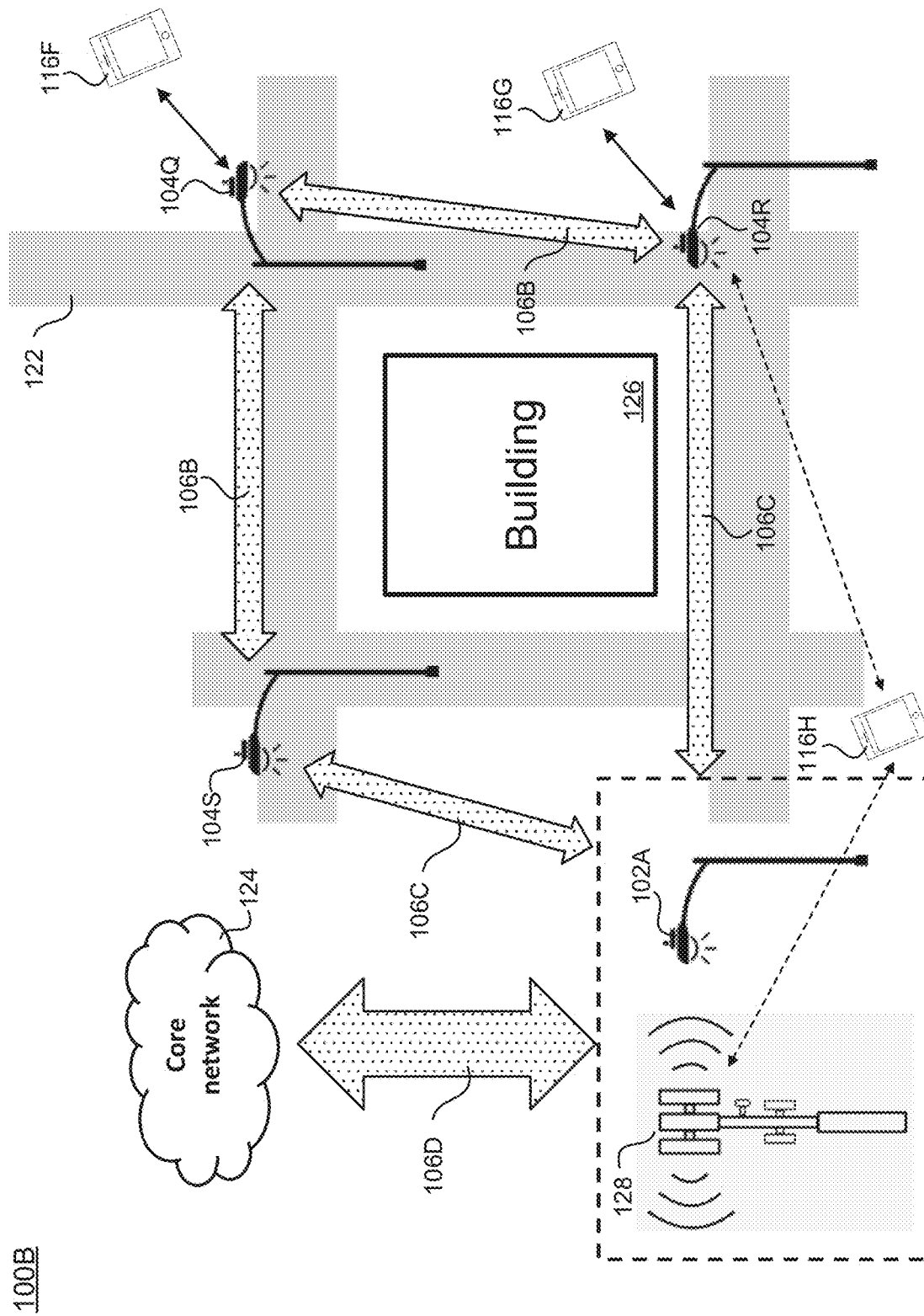
FIG. 3 illustrates another exemplary system level deployment showing an alternative TSU topology.

FIG. 3 is another exemplary system level deployment 100B showing a TSU topology embodiment. Cellular communications to and from a plurality of wireless computing devices 116F, 116G, 116H and various other telecommunications infrastructure are implemented in conformance with any known cellular protocol using any known cellular technology (e.g., 3G, 4G, 5G, 6G, GSM, CDMA, and the like).

The system level deployment 100B is deployed using streetlight-based devices along the roadway 122 of an urban environment. A building 126 occludes, obstructs, attenuates, or otherwise undesirably affects cellular communications. For such reasons, at least one TSU 102A is deployed as a baseband unit, and a plurality of one or more smart sensor devices 104Q, 104R, 104S are TSUs deployed as cellular telecom repeaters or combined baseband units and cellular telecom repeaters.

Communications in the system level deployment 100B include wireless cellular communications between one wireless computing device 116F and a smart sensor device 104Q and between another wireless computing device 116G and another smart sensor device 104R. In this case, both smart sensor device 104Q and smart sensor device 104R are TSUs that include cellular transceiver circuitry (e.g., remote radio head circuitry). As represented in FIG. 3, an additional smart sensor device 104S is a TSU that optionally may exclude any cellular transceiver circuitry. Smart sensor device 104Q communicates backhaul information to and through one or more of the other smart sensor devices 104R, 104S, which, in this embodiment, are TSUs arrange as cellular telecom repeaters.

Communications in the system level deployment 100B also include wireless cellular communications between another wireless computing device 116H and, optionally, either smart sensor device 104R or a macrocell 128. In this case, wireless computing device 116H will not communicate directly with TSU 102A because TSU 102A does not include any wireless cellular transceiver circuitry.

The macrocell 128 and TSU 102A are arranged to communicate backhaul information to the core network 124 via a dedicated backhaul communication conduit 106D. The dedicated backhaul communication conduit 106D may be wired, wireless, or a combination of wired and wireless technologies. In at least some cases, the dedicated backhaul communication conduit 106D includes fiber-optic cable arranged to communicate at a rate of at least 10 gigabits per second (10 GHz).

Repeater backhaul communications conduit 106B and repeater/baseband communications conduit 106C may also include wired, wireless, or wired and wireless communication technologies in any suitable combination. In at least some cases, repeater backhaul communications conduit 106B and repeater/baseband communications conduit 106C include fiber-optic cable arranged to communicate at a rate of at least 10 gigabits per second (10 GHz).

When a TSU 102 is operating as a repeater, the TSU 102 may include additional circuitry and features to facilitate the passage of cellular telecommunications data in to and out from the TSU. The additional circuitry and functionality may include any one or more of amplification circuitry, filtering circuitry, directionally adjustable antennas, configurable antennas, buffering circuits, data flow control circuits, and the like. As evident in the embodiment of FIG. 3, the repeater functionality of a TSU 102 provides a system to enhance mobile network coverage by receiving and retransmitting cellular telecommunications data in a previously obstructed or occluded geographic region.

Communications to and from the TSU 102 and the smart sensor devices 104 described herein (i.e., communications 106B, 106C, 106D) may be wired, wireless, or a combination of both. Fiber-optic communications have been described. In some cases, wireless line of sight communications are implemented between devices using millimeter wave or ultra-wideband circuits configured using holographic beam forming repeaters and at least one software-defined antenna. In these cases, a same band of wireless spectrum may be continuously reused at the same time in spatially diverse regions. Antennas for such devices (i.e., software-defined holographic beam formed antennas) may be arranged with narrow beam focus that is different from known multiple input, multiple output (MIMO) or phase arrays customized, for example, in the 1 GHz to 70 GHz range.

TSU 102 is configured to perform baseband operations. When a TSU 102 includes cellular transceiver circuitry, the baseband operations include processing raw data to isolate data for transmission. In some cases, the TSU may also perform operations that include packetizing the data to be transmitted, and generating intelligent overhead metadata (e.g., subscriber information, destination information, quality of service information, and other system information). In other cases, whether or not the TSU 102 has cellular transceiver circuitry, a TSU 102 will pass either packetized data or raw, un-packetized data to or from the core network 124. Ones of ordinary skill in the art will recognize that an industry term for fiber-optic cable that carries raw, un-packetized data (i.e., data having no internet protocol (IP) or Open Systems Interconnection (OSI) model intelligent metadata) at the speed of light may be referred to as "dark fiber," and fiber-optic cable that carries packetized data having some intelligent IP or OSI model metadata may be referred to as "lit fiber." In at least some cases, the interface to a core network 124 includes a layer three (L3) switch.

Figure 4:
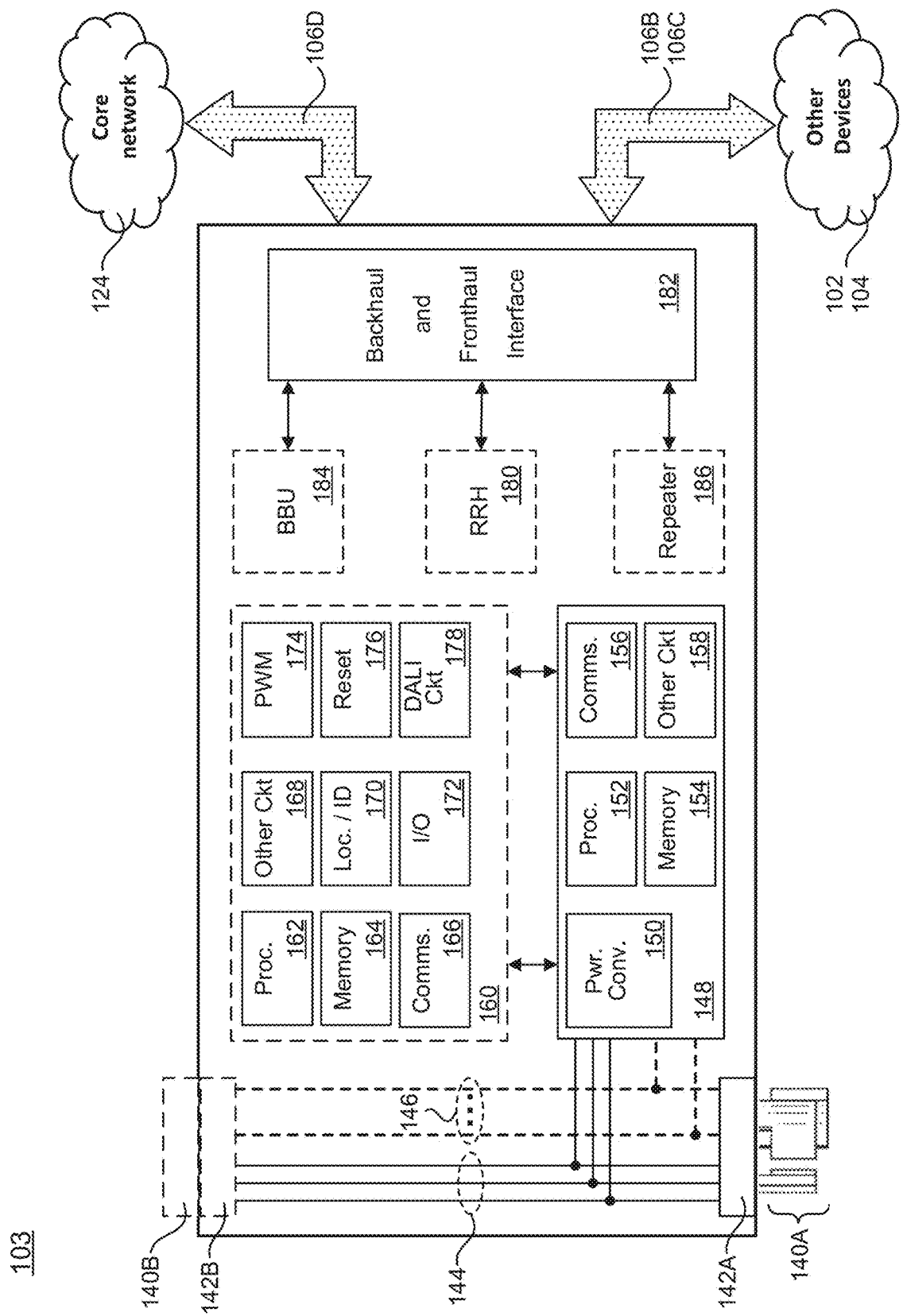
FIG. 4 illustrates an exemplary streetlight-based telecom support unit embodiment.

FIG. 4 is a telecommunication support unit (TSU) 103 embodiment. In some instances, the TSU 103 is arranged along the lines of TSU 102, 102A. In some instances, the TSU 103 is arranged along the lines of smart sensor device 104K-104P (FIG. 2) or smart sensor device 104Q-104S (FIG. 3). Accordingly, the TSU 103 may a TSU configured as a cellular telecom repeater, a baseband unit, or a combined cellular telecom repeater and baseband units.

A TSU 103 is electromechanically coupled to a streetlight fixture via a powerline interface. The powerline interface may be a standardized interface (e.g., ANSI C136.41 "NEMA" connector, Zhaga connector, or the like) or any other power interface. The powerline interface includes a powerline connector 140A. Optionally, the TSU 103 may also include a powerline connector, such as a powerline socket 140B. A housing of the TSU 103 includes a first conduit interface 142A that is optionally coupled to a second conduit interface 142B in some embodiments. A set of powerline conduits 144 and a set of optional control conduits 146 are in some cases coupled between first and second conduit interfaces 142A, 142B.

In at least some cases, standardized powerline conduits 144 are coupled to a first connection point (e.g., contact, pin, pad, terminal, lug, blade, or the like) a second connection point, and a third connection point. In at least some cases, the first connection point is wired to provide a common/neutral/ground contact, the second connection point is wired to provide a power/line voltage contact, and the third connection point is wired to provide a load contact. In at least some cases, a 260 VAC powerline source (e.g., a power grid source voltage, utility power, or the like) is coupled to the three corresponding contacts of the standardized powerline connector 140 via a streetlight. The standardized powerline connector 140 bring AC line source power into the TSU 103. In other embodiments, AC line source power (i.e., utility power) may be arranged as a powerline source providing 120 VAC, 208 VAC, 220 VAC, 240 VAC, 260 VAC, 277 VAC, 360 VAC, 415 VAC, 480 VAC, 600 VAC, or some other power source voltage.

The powerline conduits 144 and optional control conduits 146 are further coupled to a power supply module 148. In at least one embodiment, the power supply module 148 is referred to as a power board. Power supply module 148 includes power conversion circuitry 150, a processor 152, memory 154, communications circuitry 156, and other circuitry 158.

In at least some cases, the power conversion circuitry 150 includes analog front-end circuitry, powerline filter circuitry, switching power supply circuitry, power factor correction circuitry, stray voltage detection circuitry, and other such circuitry. In some cases, the power conversion circuitry 150 includes high-speed modem circuitry that enables, for example, Gigahertz networking (e.g., Ethernet) functionality over one or more programmable transmission paths and reception paths using the powerline as a communications medium. In at least some case, powerline communications functions implemented in the power conversion circuitry 150 can be used to provide backhaul services for cellular-based network functions described herein.

A processor 152 and memory 154 of the power supply 148 cooperate to implement various features of TSU 103. For example, in some cases, control signals are passed through the communications circuitry 158 and processed in accordance with executable software instructions stored in memory 154 and executed by processor 152. The control signals may, for example, control one or more fans, convection cooling or other temperature adjustment means configured as part of the other circuitry 158. Other control signals are of course contemplated.

The communications circuitry 156 may be implemented with any suitable communications circuits. An exemplary, non-exhaustive list of communication technologies, protocols, and technologies and protocols that may be implemented via communications circuitry 156 include RS-232 serial, RS-485 serial, universal serial bus (USB), Ethernet, I2C, SPI, one-wire, and the like.

In addition, or as an alternative to the fans described herein, the other circuitry 158 of the power supply module 148 may include over voltage circuitry, over current circuitry, self-test circuitry, input/output (I/O) circuitry, temperature sensing circuitry, and any other suitable circuitry.

The power supply module 148 is electrically coupled to a microcontroller 160, communicatively coupled to the microcontroller 160, or electrically and communicatively coupled to the microcontroller 160. Accordingly, power to operate the microcontroller 160 is derived from power received at the standardized powerline connector 140, generated by the power supply module 148, and passed to the microcontroller 160. The power passed to the microcontroller 160 is in some cases, direct current power at any suitable voltage (e.g., 3.3 VDC, 5 VDC, 12 VDC, 36 VDC, 48 VDC, or some other DC voltage).

Control information and data may be passed between the power supply module 148 and the microcontroller 160. For example, in some cases, control information for a streetlight is generated by the microcontroller 160, passed through the communications circuitry 156 of the power supply module 140, and further passed through the set control conduits 146 to the streetlight. Such control information may direct a light source of the streetlight to turn on, turn off, output a particular level of illumination, and the like.

The microcontroller 160, in the embodiment of FIG. 4, is arranged with a processor 162, memory 164, a communications module 166, and other circuitry 168. The microcontroller 160 also includes a location/identification module 170 (e.g., global positioning system (GPS), MAC ID, IMEI module, or some other unique location or identification structure), an input/output (I/O) module 172, a pulse width modulation (PWM) circuit 174, reset circuitry 176, and digital addressable lighting interface (DALI) circuitry 178 (e.g., a DALI controller, a DALI power supply, and the like).

The microcontroller 160 of FIG. 4 is represented with a dashed line box to make clear that in some cases, the various circuits and modules are included in a single microcontroller package, and in other cases, any one or more of the modules 162-178 may be partially included in a microcontroller package and partially outside a microcontroller package, or any one or more of the modules 162-178 may be entirely outside of the microcontroller package. Additionally, any one or more of the modules 162-178 may be optionally included or excluded.

The memory 164 may in some cases be included in the microcontroller 160, in any particular module of the microcontroller 160, or in a separate and distinct package. The memory 164 includes storage space for executable software instructions, which, when executed by processor 162, cause TSU 103 to perform any particular programmed acts. The memory 164 also includes an area to store data that is captured, received, created, determined, or in any other way generated. Implementations of a communications protocol implemented via the communications module 166 may be stored in the memory 164. The communications protocol may be any suitable protocol. In at least one embodiment, such as the embodiment of FIG. 4, a suitable communications protocol having parameters stored in memory 164 is a message queueing telemetry transport (MQTT) protocol.

Memory 164 in some embodiments includes storage for a system-wide unique identifier (SWUI). The SWUI may be stored in clear text. The SWUI may be encrypted, hashed, or obfuscated in some other way. In some cases, the SWUI is generated, populated, or otherwise implemented in cooperation with the communications module 166, the location/identification module 170, or some other electronic circuitry (e.g., module) of the TSU 103.

As described herein, a SWUI may be formed from one or more parts or whole of an international mobile subscriber identity (IMSI) code, mobile country code (MCC), mobile network code (MNC), mobile sequential serial number (MSIN), electronic serial number (ESN), integrated circuit card identifier (ICCID), international mobile equipment identifier (IMEI), mobile station ISDN number (MSISDN), MAC address, one-time random number generator, or some other extended unique identifier (EUI) information or combination thereof. The SWUI may be used in, or in association with, communications between the TSU 103 and a remote computing server. The SWUI information identifies the particular TSU 103 amongst other devices (e.g., other TSUs 103, smart sensor devices 104, and the like) communicating with the remote computing server.

In the embodiment of FIG. 4, processor 162 is arranged to execute software instructions (i.e., code) stored in memory 164. The execution of such code may include retrieving particular data stored in the memory 164, and in at least some cases the cooperation between the executing software code and the data stored in the memory 164 causes the I/O module 172 to operate the PWM circuitry 174, the DALI circuitry 178, or any of the other circuitry 168. In at least one example, executed code is arranged to direct output of visual light from a corresponding luminaire in accordance with a pulse width modulate (PWM) signal generated by the PWM module 174.

As described herein, the microcontroller 160 of TSU 103 may be arranged to operate semi-autonomously. The microcontroller 160 may direct the communication of status information, warning information, alerts, or any other suitable information toward a customer-based computing server. The information may be communicated on a schedule, at a request, or upon an event. The information, once passed, may be used, for example, to populate one or more web pages deliverable to a user via a web-based management tool. In order to perform such communication, the information may be passed to and from the microcontroller 160 via the communications module 166.

In the embodiment of FIG. 4, the communications module 166 may be arranged as a wireless connection device capable of communicating on any suitable medium (e.g., radio frequency (RF), optical, audio, ultrasound, or some other part of the electromagnetic spectrum). In at least some cases, the communications module 166 is arranged for a communication medium that conforms to a cellular or cellular-based protocol (e.g., 4G, LTE, 5G, 6G, or the like). Alternatively, or in addition, Notwithstanding the discussion herein, one of skill in the art will recognize that the DALI circuitry 178 may be implemented in a variety of ways without diverting from the teaching of the present disclosure. Such DALI circuitry 178 may generate communication signals for a streetlight or some other electronic circuit.

In some cases, the other circuitry 168 includes a light sensor circuit that provides data for analysis by the processor 162 to control the light source of one or more associated streetlights. In at least some embodiments, electrically coupling a light sensor to a processor-based light control circuit includes passing a signal representing an amount of light detected by the light sensor to the processor 162 of the processor-based light control circuit. In at least some of these embodiments, the light sensor is arranged to detect an amount of lux, lumens, or other measurement of luminous flux and generate the signal representing the amount of light detected. The processor 160 is arranged to provide a light control signal that is passed to a respective light source.

In some cases, the processor 162 of microcontroller 160 is configured to calculate the position of the sun relative to Earth at any terrestrial coordinates. More specifically, the position of the sun relative to a specific position on Earth (e.g., latitude and longitude) may be calculated for any specific date and for any specific time. Additionally, or alternatively, a specific time on a specific date that the sun is at a specific position relative to a specific location can be calculated. This calculated value may be used as a streetlight control time parameter. In this way, if a streetlight is desirably turned on or turned off every day when the sun is at a same specific position relative to the streetlight, the specific time of day when the sun is in that relative position can be calculated for any specific date and used as a streetlight control time.

A streetlight control time, as the term is used herein, is a specific time that a light source is controlled by a microcontroller 160. A streetlight control time may be a time that the microcontroller 160 directs the light source to turn on, turn off, dim, dim to a specific light output, flash, flash a code or an encoded message, change the properties of generated light (e.g., color, intensity, warmth, and the like), or control the streetlight in any other way. A streetlight control time may be positive or negative.

In some cases, a plurality of streetlight control times may be generated and applied. Different streetlight control times may be arranged to direct different actions of the light source. A plurality of streetlight control times may be prioritized. Accordingly, the concept of streetlight control times is flexibly implemented, and the implementation of many different types and functions of streetlight control times is contemplated.

In at least one embodiment, a streetlight control time desirably directs a streetlight to turn off at, or soon after, sunrise when the sun is at a first specific position relative to the streetlight. In at least one embodiment, a streetlight control time desirably directs a streetlight to turn on at, or soon before, sunset when the sun is at a second specific position relative to the streetlight. Using the terrestrial position of the streetlight (e.g., as determined by a location/identification module 170), a first streetlight control time in any given day when the sun is at the first specific position can be calculated, and a second streetlight control time in the given day when the sun is at the second specific position can be calculated. These two specific streetlight control times can be used to turn off the streetlight in the morning and to turn on the streetlight at night.

Because the microcontroller 160 may be equipped with communication capabilities, each light source associated with each TSU 103 can be controlled remotely as an independent light source or in combination with other light sources. The communicative relationship to, from, or to and from each of the TSUs 103 may be a direct communication or an indirect communication. That is, in some cases, one of a plurality of light poles and fixtures with a TSU 103 may communicate directly to another light pole and fixture with a TSU 103, or a light pole and fixture with a TSU 103 may communicate via one or more other light poles and fixtures with TSUs 103 or via some other means (e.g., via a cellular communication to a traditional cellular macrocell, via a wired connection, or the like). Such direct and indirect communications may be facilitated via TSUs 103 configured as repeaters, baseband units, or combined repeaters and baseband unit.

The microcontroller 160 may include still other features. For example, in some cases, the microcontroller 160 includes other circuitry 168 configured to perform integrated certified power metering. Such power metering may include sampling and determining power measurements of a line, a load, or concurrently a line and a load. In some cases, such power metering includes a determination of power-per-unit-time, such as kilowatt per hour. Other circuitry and functionality of the microcontroller 160 includes tilt/vibration sensing. Still other circuitry and functionality of the microcontroller 160 includes capture, collection, analysis, and communication of a last known state after a power outage.

The TSU 103 may optionally include cellular transceiver circuitry 180. The cellular transceiver circuitry 180 may be, for example configured as a remote radio head. One of skill in the art will recognize that the cellular transceiver circuitry 180 will typically include a transceiver front-end arranged for bidirectional communication with one or more wireless computing devices (e.g., subscriber devices, cell phones, smartphones, IOT devices, IIOT devices, and the like). In some cases, however, a TSU 103 does not include any cellular transceiver circuitry 180 that would permit direct communication with a wireless computing device (e.g., subscriber device, cell phone, smartphone, IOT device, IIOT device, and the like).

An interface 182 is configured as a backhaul interface, a fronthaul interface, or an interface having both backhaul and fronthaul functionality. A backhaul interface is arranged to provide communication functionality to and from a core network 124 according to a dedicated backhaul communication conduit 106D as described herein. A fronthaul interface is arranged to provide communication functionality to and from other devices (e.g., one or more TSU 102 devices and/or one or more smart sensor devices 104) according to a repeater backhaul communication conduit 106B and/or repeater/baseband backhaul communication conduit 106C as described herein.

Figure 5:
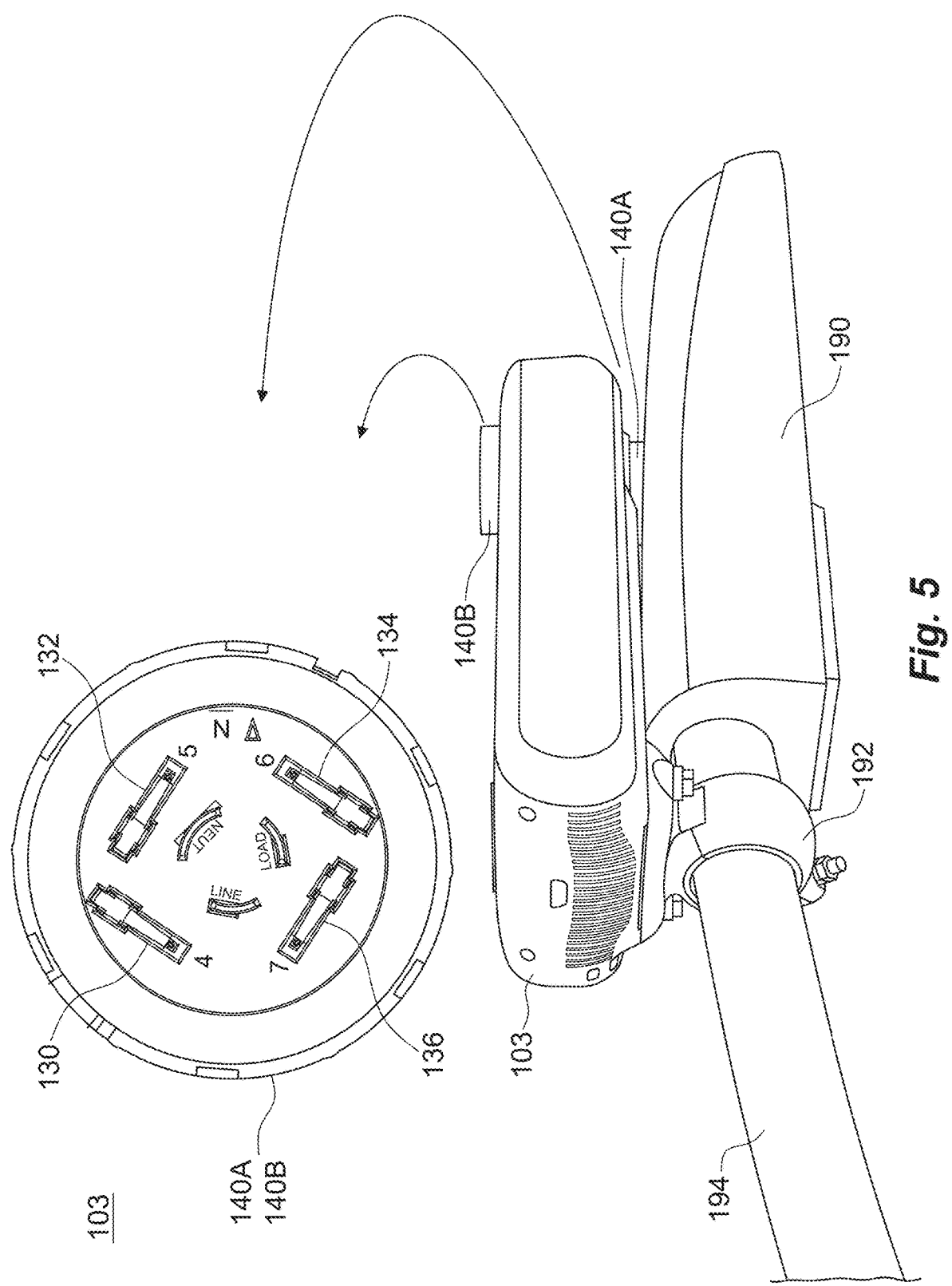
FIG. 5 illustrates another exemplary telecom support unit electromechanically coupled to a streetlight, in accordance with an alternative embodiment of the present disclosure.

FIG. 5 illustrates an exemplary TSU 103 as electromechanically coupled to a streetlight 190. As shown, a clamp 192 may be integrated with, or otherwise coupled to, a housing of the TSU 103. In such a case, the clamp 192 mechanically and removably binds the TSU 103 housing to a support arm 194 of the light pole that supports the streetlight 190.

The housing of the TSU 103 itself may include many useful features. One of skill in the art will recognize the harsh and potentially severe environment in and around a streetlight luminaire. The housing of the exemplary TSU 103 is arranged in size, shape, and color to be virtually unnoticeable by a ground-based person. In some cases, a top edge of the housing is angled to make the TSU 103 appear visually smaller when observed from the ground. That is, if a TSU has a generally rectangular cross section when viewed from any one or more three-dimensional perspectives (i.e., x-direction, y-direction, and z-direction), a bottom surface of the TSU housing may have a larger area and profile than a top surface. To achieve this relationship, vertical walls of the TSU 103 may be angled inward from bottom to top.

In some cases, the TSU 103 housing is IP66 certified to resist the ingress of moisture when the TSU 103 is deployed on a streetlight. In some cases, one or more portions of the TSU housing are made of a metal, which provide structural strength. In some cases, one or more portions of the TSU housing are made of a material that substantially passes radio frequency (RF) energy, such as a plastic. In at least some cases, a TSU housing includes venting apertures formed to encourage one-directional airflow, fans, or other ventilating structures.

The TSU housing is also arranged with boundary structures (i.e., corners, walls, bottom surfaces, top surfaces, venting, heat-sinks, connectors, assembly hardware (e.g., screws, nuts, bolts, clamps, cabling, and the like)) that reduce wind-load and reduce the collection of snow, water, dust, and other foreign particles.

In at least some cases, the generally rectangular shape of a TSU housing has a length of between about four inches (4 in.) and twenty-four inches (24 in.), a width of between about three inches (3 in.) and sixteen inches (16 in.) and a nominal height of between about one inch (1 in.) and about six inches (6 in.). In at least one case, the outer boundaries of a TSU 103 housing, excluding any clamp structures, measure about sixteen inches by nine inches by four inches (16 in.×9 in.×4 in.).

Clamp 192 is particularly arranged for binding to a substantially cylindrical structure. In at least some cases, the clamp 192 is arranged to support the installation of a TSU 103 by bearing at least a portion of the weight of TSU 103 during installation, which reduces mechanical strain on the standardized powerline connector 140A during rotational coupling of a powerline connector 140A with a corresponding powerline socket integrated in a streetlight. It is recognized that the luminaire housing of streetlight 190 includes a standardized powerline socket along the lines of standardized power line socket 140B.

A bottom-up view of a standardized powerline connector 104A, or a top-down view of a standardized powerline socket 104B is presented in FIG. 5. Seven contact surfaces are shown in a configuration that complies with a particular standardized powerline interface (e.g., ANSI C136.41); however, the principles described herein may be suitably applied to other standardized powerline interfaces (e.g., Zhaga Consortium and the like). A physical marking, "N," and a corresponding arrow may be labeled on the base to guide an installer as to the proper orientation of a connector or socket when installed.

In the embodiment of FIG. 5, the standardized powerline interface has a set of primary contacts arranged to carry a Line voltage signal, a Load voltage signal, and a Neutral voltage signal, each of which is located about a central location in the base of the standardized powerline connector 104A or standardized powerline socket 104B (i.e., semi-circular contact structures (e.g., pins, blades, connectors, or the like) physically labeled "Line," "Load," and "Neut." on the connector). The primary contacts are arranged to pass a plurality of power transmission signals, which may be high voltage alternating current signals (AC) of 220 VAC, 280 VAC, 480 VAC, 600 VAC, or some other voltage.

The standardized powerline interface further has a set of secondary contacts, which includes a first pair of secondary contacts 130, 132 (i.e., two offset spring steel contacts physically labeled "4" and "5," respectively, on the connector represented in FIG. 5) and a second pair of secondary contacts 134, 136 (i.e., two offset spring steel contacts physically labeled "6" and "7," respectively, on the connector represented in FIG. 5). In cases where the standardized powerline interface conforms to a NEMA-based protocol such as ANSI C136.41, the first and second pairs of secondary contacts may be referred to as NEMA pins 4/5 and NEMA pins 6/7, respectively. In some cases, the set of pins 4/5 or set of pins 6/7 is arranged to carry a plurality of optional dimmer control signals. In cases where the two sets of secondary contacts pass dimmer control signals, it is recognized that four dimmer control signals permit two independent dimmer control channels. In some cases, a single dimmer control signal is used as a node for a reference plane (e.g., an earth/chassis ground), and three separate dimmer control signals are implemented or implementable. In other cases, at least some of the four secondary contacts are arranged to communicate encoded binary data, and in still other cases, the secondary contacts implement a particular communication protocol (e.g., USB, I2C, SPI, or the like).

Figure 6:
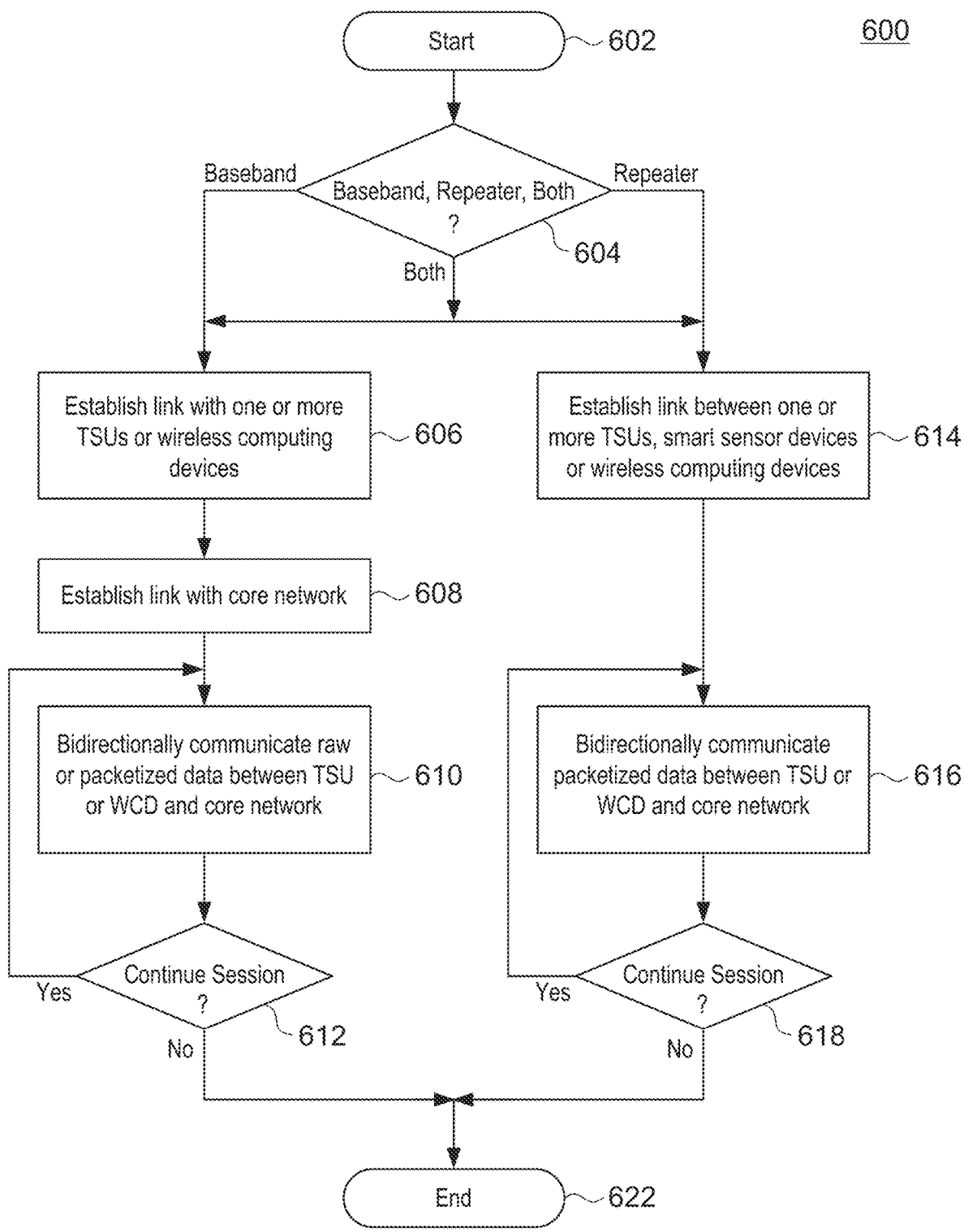
FIG. 6 illustrates a data flow diagram representing exemplary processing of a streetlight-based telecom support unit.

FIG. 6 is an exemplary data flow diagram 600 representing processing of a streetlight-based TSU. The TSU of FIG. 6 is an IIOT device along the lines of TSU 102, TSU 103, or a smart sensor device 104 (FIGS. 1-5). Processing begins at 602.

At 604, operational features of the particular TSU are identified. In some cases, the identification of such features includes an active computational process (e.g., a programmatic process wherein selection, enablement, and control of desired features is implemented, in some cases, via a processor executing software). For example, a TSU of embodiment 600 may include hardware, software, or hardware and software permitting the TSU to be configured as a baseband unit, a repeater unit, or a combined baseband and repeater unit. Further computational processes may enable, disable, or even determine if cellular transceiver remote radio head circuitry is available in the TSU. In other cases, the identification of features or capabilities of the TSU include a hardware configuration (e.g., switches, jumper wires, or the like), and in still other cases, a particular TSU is singly and fixedly configured as one of a baseband unit, a cellular telecom repeater, or a combined baseband unit and cellular telecom repeater.

A TSU of embodiment 600 having functionality of a baseband unit will include processing at 606, 608, 610, and 612. Alternatively, or additionally, a TSU having functionality of a repeater will include processing at 614, 616, and 618. The baseband and repeater processing may occur simultaneously, concurrently, sequentially, or in some other way.

At 606, a TSU having baseband functionality will establish a communicative link with one or more other TSUs, wireless computing devices, or TSUs and wireless computing devices. At 608, the TSU will establish one or more shared or separate and distinct communicative links with a core network. The communicative link formed at 606 may be along the lines of communications passed via repeater/baseband backhaul communication conduit 106C (FIG. 3). Alternatively, or additionally, the communicative link formed at 606 may include cellular communications passed between a wireless computing device and the cellular telecommunication transceiver of remote radio head circuitry in the TSU. The communicative link formed at 608 may be along the lines of communications passed via dedicated backhaul communication conduit 106D (FIG. 3).

At 610, data between the devices and core network are bidirectionally communicated. The bidirectional communications session will be continued at 612 or terminated at 622.

At 614, a TSU having repeater functionality will establish a link between a TSU of embodiment 600 and one or more other TSUs, a smart sensor device, or a wireless computing device. The communicative link formed at 614 may be along the lines of communications passed via repeater backhaul communication conduit 106B (FIG. 3). Alternatively, or additionally, the communicative link formed at 614 may include cellular communications passed between a wireless computing device and the cellular telecommunication transceiver of remote radio head circuitry in the TSU.

At 616, data is bidirectionally communicated between the devices. The bidirectional communications session will be continued at 618 or terminated at 622.

Considering the light control operations of a microcontroller 160 as taught in the present disclosure, several terms are now discussed. For example, within the context of the present disclosure, the term, "sunrise," means an instant near daybreak of any given day under ideal meteorological conditions and with standard refraction of the rays of the sun when the upper edge of the sun's perimeter is coincident with an ideal horizon. Additionally, within the context of the present disclosure, the term, "sunset," means an instant near nightfall of any given day under ideal meteorological conditions and with standard refraction of the rays of the sun when the upper edge of the sun's perimeter is coincident with an ideal horizon.

The microcontroller 160 includes a location/identification module 170. Once the microcontroller 160 is deployed, the location/identification module 170 may be accessed to receive, calculate, generate, or otherwise isolate a specific terrestrial position of the microcontroller 160. In at least some cases, the specific terrestrial position includes a first value representing a latitude and a second value representing a longitude.

The microcontroller 160 is a real time device. That is, at any given time, the microcontroller 160 may retrieve, receive, calculate, generate, or otherwise isolate a specific date and a specific time. In some cases, time and date values are parsed from data received by the location/identification module 170. In these or other cases, time and date values are parsed from data received by the communications module 166 (e.g., a transceiver arranged for communications according to a cellular-based protocol). In these or still other cases, time and date values are retrieved from other circuitry 168, which may include a real-time clock circuit. Other means of isolating a time value and a date value are contemplated.

The microcontroller 160 may be configured to calculate one or more positions of the sun relative to the terrestrial position of the microcontroller 160. Accordingly, the microcontroller 160 may be arranged to calculate any number of desirable solar time values. For example, considering the specific terrestrial location of the microcontroller 160, a time of sunrise at that terrestrial location may be calculated, a time of civil dawn at that terrestrial location may be calculated, a time of sunset at that terrestrial location may be calculated, a time of civil dusk at that terrestrial location may be calculated, a time when the sun is at a zero degrees (0°) zenith angle at that terrestrial location may be calculated, or any other time associated with a specific position of the sun relative to the terrestrial position of the microcontroller 160 may be calculated. More specifically, in at least some embodiments, the memory 164 may include at least one algorithmic module that calculates specific local time values when the sun will be in a specific position.

Having now set forth certain embodiments, further clarification of certain terms used herein may be helpful to providing a more complete understanding of that which is considered inventive in the present disclosure. For example, Internet of Things (IOT) and Industrial Internet of Things (IIOT) devices are fixed and/or mobile electronic computing devices that are coupled or coupleable to a computing network. IOT devices are often described as devices with consumer facing applicability and IIOT devices are often described as devices with industrial or machine-to-machine applicability. The two types of devices (i.e., IOT and IIOT devices) have one or more computing processors, memory storing instructions that direct operations of the one or more computing processors, and network circuitry. In many cases, the IOT and IIOT devices also include a power source (e.g., one or more of a battery, a physical power interface, a power supply, a photovoltaic cell, an induction coil, etc.), at least one sensor (e.g., accelerometer, photo sensor, thermometer, and many others), and memory to store data collected by the device. The present disclosure will use the term IIOT devices, but it is recognized that the principles described herein are equally applicable to IOT devices.

Rather than a general-purpose computing device, an IIOT device is typically arranged to perform a particular function or set of functions. An IIOT device may, for example, be arranged as an environmental sensor that collects data such as temperature, humidity, air quality, and the like. In these cases, the IIOT device is deployed in a city, rural area, or some other location, and the device is either programmed on site or at the factory to communicate with a specific remote computing server. The remote computing server may be arranged at a great distance (e.g., tens, hundreds, or even thousands of miles away) from the IIOT device. Alternatively, the remote computing server may be a smart phone tablet, or other computing device permanently or transitorily arranged a short distance (e.g., tens or hundreds of feet or inches or some other distance) from the IIOT device. In these cases, the IIOT device is programmed to communicate data to, from, or to and from a specific remote computing server.

Mobile network operators (MNOs) provide wireless cellular-based services in accordance with one or more cellular-based technologies. As used in the present disclosure, "cellular-based" should be interpreted in a broad sense to include any of the variety of technologies that implement wireless or mobile communications. Exemplary cellular-based systems include, but are not limited to, time division multiple access ("TDMA") systems, code division multiple access ("CDMA") systems, and Global System for Mobile communications ("GSM") systems. Some others of these technologies are conventionally referred to as UMTS, WCDMA, 4G, 5G, 6G, and LTE. Still other cellular-based technologies are also known now or will be known in the future. The underlying cellular-based technologies are mentioned here for a clearer understanding of the present disclosure, but the inventive aspects discussed herein are not limited to any particular cellular-based technology.

In some cases, cellular-based voice traffic is treated as digital data. In such cases, the term "voice-over-Internet-Protocol", or "VoIP," may be used to mean any type of voice service that is provided over a data network, such as an Internet Protocol (IP) based network. The term VoIP is interpreted broadly to include any system wherein a voice signal from a mobile computing device is represented as a digital signal that travels over a data network. VoIP then may also include any system wherein a digital signal from a data network is delivered to a mobile computing device where it is later delivered as an audio signal.

Standardized powerline interface connector devices of the types described herein are in at least some cases referred to as NEMA devices, NEMA compatible devices, NEMA compliant devices, or the like. And these devices include receptacles, connectors, sockets, holders, components, etc. Hence, as used in the present disclosure and elsewhere, those of skill in the art will recognize that coupling the term "NEMA" or the term "ANSI" with any such device indicates a device or structure compliant with a standard promoted by a standards body such as NEMA, ANSI, IEEE, or the like.

A wireless computing device, which may also be referred to as a mobile device or mobile computing device, is an electronic device provisioned by at least one mobile network operator (MNO) to communicate data through the MNO's cellular-based network. The data may be voice data, short message service (SMS) data, electronic mail, world-wide web or other information conventionally referred to as "internet traffic," or any other type of electromagnetically communicable information. The data may be digital data or analog data. The data may be packetized or non-packetized. The data may be formed or passed at a particular priority level, or the data may have no assigned priority level at all. A non-comprehensive, non-limiting list of wireless computing devices is provided to aid in understanding the bounds of the term, "wireless computing device," as used herein. Wireless computing devices include cell phones, smart phones, flip phone, tablets, phablets, handheld computers, laptop computers, body-worn computers, and the like. Certain other electronic equipment, such as IOT devices, IIOT devices, smart devices, and other like computing devices in any form factor, may also be referred to as a wireless computing device when this equipment is provisioned for cellular-based communication on an MNO's cellular-based network. Examples of this other electronic equipment include in-vehicle devices, medical devices, industrial equipment, retail sales equipment, wholesale sales equipment, utility monitoring equipment, streetlight controllers, small cells, transformer monitors, any type of "smart-city" devices, and other such equipment used by private, public, government, and other entities.

Wireless computing devices further have a collection of input/output ports for passing data over short distances to and from the mobile device. For example, serial ports, USB ports, Wi-Fi ports, Bluetooth ports, IEEE 1394 FireWire, and the like can communicatively couple the mobile device to other computing apparatuses.

Wireless computing devices have a battery or other power source, and they may or may not have a display. In many wireless computing devices, a signal strength indicator is prominently positioned on the display to provide network communication connectivity information to the wireless computing device user.

A cellular transceiver is used to couple the wireless computing device to other communication devices through the cellular-based communication network. In some cases, software and data in a file system are communicated between the wireless computing device and a computing server via the cellular transceiver. That is, bidirectional communication between a wireless computing device and a global or local computing server is facilitated by the cellular transceiver. For example, a computing server may download a new or updated version of software to the wireless computing device over the cellular-based communication network. As another example, the wireless computing device may communicate any other data to the computing server over the cellular-based communication network.

Each wireless computing device client has electronic memory accessible by at least one processing unit within the device. The memory is programmed with software that directs the one or more processing units. Some of the software modules in the memory control the operation of the wireless computing device with respect to generation, collection, and distribution or other use of data. In some cases, software directs the collection of individual datums, and in other cases, software directs the collection of sets of data.

Where set forth in the present disclosure, data flow diagrams (e.g., FIG. 6) illustrate non-limiting processes that may be used by embodiments of an IIOT device such as a TSU 102, 103 or smart sensor device 104. In this regard, each described process may represent a module, segment, or portion of software code, which comprises one or more executable instructions for implementing the specified logical function(s). It should also be noted that in some implementations, the functions noted in the process may occur in a different order, may include additional functions, may occur concurrently, and/or may be omitted.

The figures in the present disclosure illustrate portions of one or more non-limiting computing devices embodiments such as one or more TSU 102, 103 or smart sensor device 104. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry.

Processing devices, or "processors," as described herein, include central processing units (CPUs), microcontrollers (MCU), digital signal processors (DSP), application specific integrated circuits (ASIC), peripheral interface controllers (PIC), state machines, and the like. Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. Processors may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor, which when executed, carries out one or more of the method acts.

The present disclosure discusses several embodiments of industrial internet of things (IIOT) devices (e.g., one or more TSUs 102, 103 or smart sensor devices 104) that include or otherwise cooperate with one or more computing devices. It is recognized that these IIOT devices are arranged to perform one or more algorithms to implement various concepts taught herein. Each of said algorithms is understood to be a finite sequence of steps for solving a logical or mathematical problem or performing a task. Any or all of the algorithms taught in the present disclosure may be demonstrated by formulas, flow charts, data flow diagrams, narratives in the specification, and other such means as evident in the present disclosure. Along these lines, the structures to carry out the algorithms disclosed herein include at least one processing device executing at least one software instruction retrieved from at least one memory device. The structures may, as the case may be, further include suitable input circuits known to one of skill in the art (e.g., keyboards, buttons, memory devices, communication circuits, touch screen inputs, and any other integrated and peripheral circuit inputs (e.g., accelerometers, thermometers, light detection circuits and other such sensors)), suitable output circuits known to one of skill in the art (e.g., displays, light sources, audio devices, tactile devices, control signals, switches, relays, and the like), and any additional circuits or other structures taught in the present disclosure. To this end, every invocation of means or step plus function elements in any of the claims, if so desired, will be expressly recited.

As known by one skilled in the art, TSUs 102, 103 and smart sensor devices 104 have one or more memories, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor. Some or all of the stored contents of a memory may include software instructions executable by a processing device to carry out one or more particular acts.

The TSUs 102, 103 and smart sensor devices 104 illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the TSUs 102, 103 and smart sensor devices 104 are a single hardware machine having at least some of the hardware and software listed herein, and in other cases, the TSUs 102, 103 and smart sensor devices 104 are a networked collection of hardware and software machines working together cooperatively in a server farm, cluster, cloud, or other networked environment to execute the functions of one or more embodiments described herein. Some aspects of the conventional hardware and software of the particular computing device are not shown in the figures for simplicity.

When so arranged as described herein, each IIOT device (e.g., each TSU 102, 103 and smart sensor device 104) may be transformed from a generic and unspecific computing device to a combination device arranged comprising hardware and software configured for a specific and particular purpose such as to provide a determined technical solution. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The embodiments described herein use computerized technology to improve the technology of smart streetlight controllers and other processor-based "smart" devices, but other techniques and tools remain available to provision said IIOT devices and other smart devices. Therefore, the claimed subject matter does not foreclose the whole or even substantial streetlight controller technical field. The innovation described herein uses both new and known building blocks combined in new and useful ways along with other structures and limitations to create something more than has heretofore been conventionally known. The embodiments improve on computing systems which, when un-programmed or differently programmed, cannot perform or provide the specific streetlight control features that include onboard calculation of the position of the sun relative to a terrestrial position of the smart streetlight controller on any given day as taught herein. The embodiments described in the present disclosure improve upon known streetlight controller processes and techniques. The computerized acts described in the embodiments herein are not purely conventional and are not well understood. Instead, the acts are new to the industry. Furthermore, the combination of acts as described in conjunction with the present embodiments provides new information, motivation, and business results that are not already present when the acts are considered separately. There is no prevailing, accepted definition for what constitutes an abstract idea. To the extent the concepts discussed in the present disclosure may be considered abstract, the claims present significantly more tangible, practical, and concrete applications of said allegedly abstract concepts. And said claims also improve previously known computer-based systems that perform streetlight controller functions and other smart computing device operations.

Software may include a fully executable software program, a simple configuration data file, a link to additional directions, or any combination of known software types. When a computing device updates software, the update may be small or large. For example, in some cases, a computing device downloads a small configuration data file to as part of software, and in other cases, a computing device completely replaces most or all of the present software on itself or another computing device with a fresh version. In some cases, software, data, or software and data is encrypted, encoded, and/or otherwise compressed for reasons that include security, privacy, data transfer speed, data cost, or the like.

Repositories (e.g., database structures), if any are present in the IIOT and other computing systems described herein, may be formed in a single repository or multiple repositories. In some cases, hardware or software storage repositories are shared amongst various functions of the particular system or systems to which they are associated. A repository (e.g., database) may be formed as part of a local system or local area network. Alternatively, or in addition, a repository may be formed remotely, such as within a distributed "cloud" computing system, which would be accessible via a wide area network or some other network.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

In at least one embodiment, devices such as the TSUs 102, 103 and the smart sensor devices 104 may communicate with other devices via communication over a network. The network may involve an Internet connection or some other type of local area network (LAN) or wide area network (WAN). Non-limiting examples of structures that enable or form parts of a network include, but are not limited to, an Ethernet, twisted pair Ethernet, digital subscriber loop (DSL) devices, wireless LAN, Wi-Fi, Worldwide Interoperability for Microwave Access (WiMax), or the like.

In the present disclosure, memory may be used in one configuration or another. The memory may be configured to store data. In the alternative or in addition, the memory may be a non-transitory computer readable medium (CRM). The CRM is configured to store computing instructions executable by a processor of a TSU 102, 103 or smart sensor device 104. The computing instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of an IIOT device or some other computing system.

Buttons, keypads, computer mice, memory cards, serial ports, bio-sensor readers, touch screens, and the like may individually or in cooperation be useful to a technician operating an IIOT device or other computing system. The devices may, for example, input control information into the system. Displays, printers, memory cards, LED indicators, temperature sensors, audio devices (e.g., speakers, piezo device, etc.), vibrators, and the like are all useful to present output information to the technician operating the IIOT device or other computing system. In some cases, the input and output devices are directly coupled to the TSUs 102, 103 and smart sensor devices 104 and electronically coupled to a processor or other operative circuitry. In other cases, the input and output devices pass information via one or more communication ports (e.g., RS-232, RS-485, infrared, USB, etc.).

As described herein, for simplicity, a technician may in some cases be described in the context of the male gender. It is understood that a technician can be of any gender, and the terms "he," "his," and the like as used herein are to be interpreted broadly inclusive of all known gender definitions. As the context may require in this disclosure, except as the context may dictate otherwise, the singular shall mean the plural and vice versa; all pronouns shall mean and include the person, entity, firm or corporation to which they relate; and the masculine shall mean the feminine and vice versa.

As used in the present disclosure, the term "module" refers to an application specific integrated circuit (ASIC), an electronic circuit, a processor and a memory operative to execute one or more software or firmware programs, combinational logic circuitry, or other suitable components (hardware, software, or hardware and software) that provide the functionality described with respect to the module.

The terms, "real-time" or "real time," as used herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds or milliseconds), and that the activity may be performed on an ongoing basis (e.g., inputting system-wide unique identifiers (SWUIs) of a plurality of IOT devices, IIOT devices, or other smart computing devices, inputting batch IDs, receiving information from the particular computing device, and the like). An example of an activity that is not real-time is one that occurs over an extended period of time (e.g., days, months, or years for a single instance) or that occurs based on intervention or direction by a technician or other activity.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a TSU 102, 103 or smart sensor device 104 may be described as being mounted "substantially horizontal," In these cases, a device that is mounted exactly horizontal is mounted along an "X" axis and a "Y" axis that is normal (i.e., 90 degrees or at right angle) to a plane or line formed by a "Z" axis. Different from the exact precision of the term, "horizontal," and the use of "substantially" or "about" to modify the characteristic permits a variance of the particular characteristic by up to 30 percent. As another example, a TSU 102, 103 or a smart sensor device 104 having a particular linear dimension of between about six (6) inches and twelve (12) inches includes such devices in which the linear dimension varies by up to 30 percent. Accordingly, the particular linear dimension of the small cell networking device may be between 2.4 inches and 15.6 inches.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

In the present disclosure, when an element (e.g., component, circuit, device, apparatus, structure, layer, material, or the like) is referred to as being "on," "coupled to," or "connected to" another element, the elements can be directly on, directly coupled to, or directly connected to each other, or intervening elements may be present. In contrast, when an element is referred to as being "directly on," "directly coupled to," or "directly connected to" another element, there are no intervening elements present.

The terms "include" and "comprise" as well as derivatives and variations thereof, in all of their syntactic contexts, are to be construed without limitation in an open, inclusive sense (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the present disclosure, the terms first, second, etc., may be used to describe various elements, however, these elements are not to be limited by these terms unless the context clearly requires such limitation. These terms are only used to distinguish one element from another. For example, a first machine could be termed a second machine, and, similarly, a second machine could be termed a first machine, without departing from the scope of the inventive concept.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

The use of the phrase "set" (e.g., "a set of items") or "subset," unless otherwise noted or contradicted by context, is to be construed as a nonempty collection comprising one or more members.

The telecom support units (TSUs) and systems described in the present disclosure provide several technical effects and advances to the field of cellular telecommunications. Technical effects and benefits include the ability to improve the reliability and safety of the world's various telecommunications systems by providing or otherwise improving densification, redundancy, a reduced number of failure points, greater bandwidth, the ability to support more users of wireless devices, an efficient and seamless integration with existing telecommunication networks, and many more. The amount of high-bandwidth communication medium (e.g., fiberoptic cable, point-to-point microwave, and the like) may be reduced. By placing the TSUs of the present disclosure at the streetlight level, opportunities for unobstructed line of sight communications are improved. Along these lines, there are opportunities to locate TSUs on streetlights positioned at roadway corners or intersections, which permit advanced telecommunication infrastructures, such as millimeter wave technologies to communicate around the corners of buildings. In telecommunication paths that are obstructed or otherwise occluded, the TSUs of the present disclosure enable robust data connectivity. In addition, where the expense, difficulty, inconvenience, or other circumstance prevents the provision of hardwired backhaul connectivity (e.g., dark fiber) to every small cell, the TSUs of the present disclosure permit one such hardwired TSU configured as a baseband device to serve multiple small cells.

The present disclosure sets forth details of various structural embodiments that may be arranged to implement the teaching of the present disclosure. By taking advantage of the flexible circuitry, mechanical structures, computing architecture, and communications means described herein, a number of exemplary devices and systems are now disclosed.

Example A-1 is a telecommunications system, comprising a plurality of remote radio head devices; a core network; and at least one baseband processing unit, the baseband processing unit including: a housing; a standardized powerline connector integrated though a first wall of the housing; a high-bandwidth communication medium interface integrated through a second wall of the housing; a backhaul communication medium interface integrated through a third wall of the housing; and a baseband module having a first communication medium coupled to the backhaul interface and second communication medium coupled to the high-bandwidth communication medium interface;

wherein the plurality of remote radio head devices are communicatively coupled to the at least one baseband processing unit via the high-bandwidth communication medium interface, and wherein the baseband module is coupled to the core network via the backhaul interface.

Example A-2 may include the subject matter of Example A-1, and alternatively or additionally any other example herein, wherein the housing is between about four inches long (4 in.) and about twenty-four inches long (24 in.), the housing is between about two inches wide (2 in.) and about sixteen inches wide (16 in.), and between about one inch tall (1 in.) and about six inches tall (6 in.).

Example A-3 may include the subject matter of Example A-2, and alternatively or additionally any other example herein, wherein the housing is formed, at least in part, from a glass-filled material.

Example A-4 may include the subject matter of any of Examples Al to A-3, and alternatively or additionally any other example herein, wherein the housing is formed, at least in part, from both metal and plastic materials.

Example A-5 may include the subject matter of any of Examples Al to A-4, and alternatively or additionally any other example herein, wherein the high-bandwidth communication interface is arranged to communicate data at a rate of at least ten gigabits per second (10 Gbps).

Example A-6 may include the subject matter of any of Examples A-1 to A-5, and alternatively or additionally any other example herein, wherein baseband processing unit is an industrial internet of things (IIOT) device.

Example A-7 may include the subject matter of any of Examples A-1 to A-6, and alternatively or additionally any other example herein, wherein the baseband processing unit is arranged for coupling to a streetlight luminaire via a standardized powerline interface.

Example A-8 may include the subject matter of Example A-7, and alternatively or additionally any other example herein, wherein the standardized powerline interface is compliant with ANSI C136.41.

Example A-9 may include the subject matter of any of Examples A-1 to A-8, and alternatively or additionally any other example herein, wherein the baseband processing unit is further arranged as a small-cell telecommunications device.

Example A-10 may include the subject matter of any of Examples A-1 to A-9, and alternatively or additionally any other example herein, wherein the baseband unit is further arranged to communicate with a plurality of IIOT devices via radio frequency (RF) communications.

Example A-11 may include the subject matter of any of Examples A-1 to A-10, and alternatively or additionally any other example herein, wherein the baseband unit is further arranged to communication with a plurality of IIOT devices via a cellular communications network.

Example A-12 may include the subject matter of any of Examples A-1 to A-11, and alternatively or additionally any other example herein, wherein communications from the baseband unit include wireless communications, wired communications, or both wired and wireless communications.

Example B-1 is a telecommunications system, comprising a plurality of remote radio head devices; a core network; and at least one streetlight-based telecom support unit. The telecom support unit includes: a housing; a clamp mechanically coupling the housing to a streetlight support structure; a standardized powerline interface integrated though a first wall of the housing and electromechanically coupling the telecom support unit to utility power; and a high-bandwidth communication medium interface integrated through a second wall of the housing, the high-bandwidth communication medium interface communicatively coupling the telecom support unit to at least one of the plurality of remote radio head devices.

Example B-2 may include the subject matter of Example B-1, and alternatively or additionally any other example herein, wherein the streetlight-based telecom support unit further comprises at least one remote radio head device.

Example B-3 may include the subject matter of any of Examples B-1 to B-2, and alternatively or additionally any other example herein, wherein the streetlight-based telecom support unit further comprises a single cellular telecommunications transceiver, the single cellular telecommunications transceiver arranged for mobile network operator subscriber-based communications only.

Example B-4 may include the subject matter of any of Examples B-1 to B-3, and alternatively or additionally any other example herein, wherein the telecom support unit is configured as a combined baseband and cellular repeater device.

Example B-5 may include the subject matter of any of Examples B-1 to B-4, and alternatively or additionally any other example herein, wherein the telecom support unit is configured as a baseband device.

Example B-6 may include the subject matter of any of Examples B-1 to B-5, and alternatively or additionally any other example herein, wherein the telecom support unit is configured as a cellular data repeater device.

Example B-7 may include the subject matter of any of Examples B-1 to B-6, and alternatively or additionally any other example herein, wherein the streetlight-based telecom support unit further comprises a microcontroller arranged to control operations of at least one streetlight.

Example B-8 may include the subject matter of any of Examples B-1 to B-7, and alternatively or additionally any other example herein, wherein the streetlight-based telecom support unit further comprises a line-side utility-grade power metering circuit and a load-side utility-grade power metering circuit, wherein the line-side utility-grade power metering circuit and load-side utility-grade power metering circuit are arranged to operate concurrently.

Example B-9 may include the subject matter of any of Examples B-1 to B-8, and alternatively or additionally any other example herein, wherein the high-bandwidth communication medium interface is a dark fiber interface.

Example B-10 may include the subject matter of any of Examples B-1 to B-9, and alternatively or additionally any other example herein, wherein the high-bandwidth communication medium interface is a lit fiber interface.

Example B-11 may include the subject matter of any of Examples B-1 to B-10, and alternatively or additionally any other example herein, wherein the high-bandwidth communication medium interface is a wireless interface.

Example B-12 may include the subject matter of any of Examples B-1 to B-11, and alternatively or additionally any other example herein, wherein the high-bandwidth communication medium interface is a wireless interface having at least one software-defined antenna.

Example C-1 is a streetlight-based telecom support unit, comprising: a generally rectangular housing; a standardized powerline connector arranged to mate with a corresponding standardized powerline socket integrated into a streetlight luminaire; a clamp arranged to mechanically couple the housing to a streetlight support arm, the clamp further arranged to reduce mechanical strain on the standardized powerline connector during rotational coupling of the standardized powerline connector with the corresponding standardized powerline socket; and a high-bandwidth communication medium interface, the high-bandwidth communication medium interface arranged to communicatively couple the streetlight-based telecom support unit to at least one a plurality of remote radio head devices.

Example C-2 may include the subject matter of Example C-1, and alternatively or additionally any other example herein, wherein the streetlight-based telecom support unit is configured as a baseband device, a cellular data repeater device, or a combined baseband and cellular data repeater device Example C-3 may include the subject matter of any of Examples C-1 to C-2, and alternatively or additionally any other example herein, wherein the generally rectangular housing of the telecom support unit includes a bottom surface integrated with a top surface by at least one angled wall, and the bottom surface has a larger area and profile than the top surface.

Example C-4 may include the subject matter of any of Examples C-1 to C-3, and alternatively or additionally any other example herein, wherein the high-bandwidth communication medium interface is a dark fiber interface.

Example D-1 is a streetlight-based telecom support unit method, comprising: providing a telecom support unit electromechanically coupled to a streetlight; forming or establishing a communication link between the telecom support unit and at least one streetlight-based remote radio head; and bi-directionally communicating cellular data between the telecom support unit and the at least one streetlight-based remote radio head.

Example D-2 may include the subject matter of Example D-1, and alternatively or additionally any other example herein, wherein streetlight-based telecom support unit method of the third embodiment may further comprise: forming or establishing a second communication link between the telecom support unit and a core network.

Example D-3 may include the subject matter of any of Examples D-1 to D-2, and alternatively or additionally any other example herein, wherein the second communication link includes at least one dark fiber conduit.

Example D-4 may include the subject matter of any of Examples D-1 to D-3, and alternatively or additionally any other example herein, wherein the streetlight-based telecom support unit method further comprises forming a second communication link between the telecom support unit and a second streetlight-based telecom support unit.

Example D-5 may include the subject matter of any of Examples D-1 to D-4, and alternatively or additionally any other example herein, wherein the second communication link includes at least one lit fiber conduit.

Example D-6 may include the subject matter of any of Examples D-1 to D-5, and alternatively or additionally any other example herein, wherein the streetlight-based telecom support unit method also includes programmatically selecting whether the streetlight-based telecom support unit will operate as at least one of a baseband device, a cellular data repeater device, or a combined baseband and cellular data repeater device.

The various embodiments described above can be combined to provide further embodiments. Various features of the embodiments are optional and features of one embodiment may be suitably combined with other embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims but should be construed to include all possible embodiments along with the full scope of equivalents to which such claims are entitled. Accordingly, the claims are not limited by the disclosure.

What is claimed is:

1. A telecommunications system providing communications for a plurality of remote cellular transceivers, the telecommunications system comprising:
    a core network; and
    at least one telecommunications support unit providing cellular-based communications connectivity between the plurality of remote cellular transceivers and the core network, each telecommunications support unit being mounted to a support structure of a respective streetlight and including:
        a housing;
        a first powerline interface configured through a boundary of the housing and connected to a power source external to the housing;
        a communication interface communicatively coupled to the remote cellular transceivers;
        a controller arranged to control operations of at least the streetlight; and
        a load-side power metering circuit that meters power consumed by at least the telecommunications support unit.

2. The telecommunications system of claim 1, wherein each telecommunications support unit further includes:
    at least one cellular transceiver coupled to the communication interface.

3. The telecommunications system of claim 1, wherein the communication interface is a high-bandwidth communication interface supporting communications at a data rate of at least ten gigabits per second (10 Gbps).

4. The telecommunications system of claim 1, wherein each telecommunications support unit is configured as a combined baseband and cellular repeater device.

5. The telecommunications system of claim 1, wherein each telecommunications support unit is configured as a baseband device or a cellular data repeater device.

6. The telecommunications system of claim 1, wherein the communication interface is configured through a second boundary of the housing.

7. The telecommunications system of claim 1, wherein each telecommunications support unit further includes:
    a line-side power metering circuit, wherein the line-side power metering circuit and the load-side power metering circuit are arranged to operate concurrently.

8. The telecommunications system of claim 1, wherein each telecommunications support unit further includes:
    a clamp mechanically coupling the housing to the support structure of the streetlight.

9. A telecommunications support unit comprising:
    a housing mountable to a support structure of a streetlight;
    a powerline interface configured though a boundary of the housing and connectable to a power source external to the housing;
    a cellular-based communication interface operable to provide communicative coupling to one or more remote cellular transceivers;
    a controller arranged to control operations of at least the streetlight; and
    a load-side power metering circuit operable to meter power consumed by at least the telecommunications support unit.

10. The telecommunications support unit of claim 9, further comprising:
    a clamp configured to enable mechanical coupling of the housing to the support structure of the streetlight.

11. The telecommunications support unit of claim 9, wherein the communication interface is a high-bandwidth communication interface supporting communications at a data rate of at least ten gigabits per second (10 Gbps).

12. The telecommunications support unit of claim 9, wherein the communication interface includes at least one cellular transceiver.

13. The telecommunications support unit of claim 9, wherein the housing includes a bottom surface integrated with a top surface by at least one angled wall and wherein the bottom surface has a larger area and profile than the top surface.

14. The telecommunications support unit of claim 9, wherein the communication interface is configured through a second boundary of the housing.

15. A method comprising:
    establishing a cellular-based communication link between a telecommunications support unit and at least one cellular transceiver, the telecommunications support unit being mounted to a support structure of a streetlight, including a controller arranged to control operations of at least the streetlight, and receiving electrical power from an external power source;
    performing, by the telecommunications support unit, load-side power metering to measure power consumed by at least the telecommunications support unit; and bidirectionally communicating cellular data between the telecommunications support unit and the at least one cellular transceiver through the communication link.

16. The method of claim 15, further comprising:
establishing a second communication link between the telecommunications support unit and a core network to support communications between the core network and the at least one cellular transceiver.

17. The method of claim 15, further comprising:
establishing a second communication link between the telecommunications support unit and a second telecommunications support unit mounted to a second structure.

* * * * *